(12) United States Patent
Washimori

(10) Patent No.: US 9,276,550 B2
(45) Date of Patent: Mar. 1, 2016

(54) IMPEDANCE MATCHING SWITCH CIRCUIT, IMPEDANCE MATCHING SWITCH CIRCUIT MODULE, AND IMPEDANCE MATCHING CIRCUIT MODULE

(71) Applicant: Murata Manufacturing Co., Ltd., Nagaokakyo-shi, Kyoto-fu (JP)

(72) Inventor: Tadashi Washimori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/249,799

(22) Filed: Apr. 10, 2014

(65) Prior Publication Data

US 2014/0340180 A1  Nov. 20, 2014

(30) Foreign Application Priority Data

May 20, 2013 (JP) .................................. 2013-106177

(51) Int. Cl.
*H01P 1/10* (2006.01)
*H03H 7/40* (2006.01)
*H01H 59/00* (2006.01)
*H01P 1/28* (2006.01)

(52) U.S. Cl.
CPC ............. *H03H 7/40* (2013.01); *H01H 59/0009* (2013.01); *H01P 1/28* (2013.01)

(58) Field of Classification Search
CPC ............ H01P 1/28; H01P 1/27; H01H 59/009

USPC .................................................. 333/262, 263
See application file for complete search history.

(56) References Cited

U.S. PATENT DOCUMENTS

| 7,619,462 B2 * | 11/2009 | Kelly et al. ................... 327/427 |
| 2008/0106353 A1 * | 5/2008 | Hangai et al. ................ 333/103 |

FOREIGN PATENT DOCUMENTS

| JP | 3-131113 A | 6/1991 |
| JP | 2003-179426 A | 6/2003 |
| JP | 2003-198076 A | 7/2003 |

OTHER PUBLICATIONS

Official Communication issued in corresponding Japanese Patent Application No. 2013-106177, mailed on Mar. 10, 2015.

* cited by examiner

*Primary Examiner* — John Poos
(74) *Attorney, Agent, or Firm* — Keating & Bennett, LLP

(57) ABSTRACT

An impedance matching switch circuit module includes a first switch device connected to first and second high-frequency input/output terminals, a second switch device connected between the first high-frequency input/output terminal and a first matching terminal, and a third switch device connected between the second high-frequency input/output terminal and a second matching terminal. Impedance matching elements having appropriately set element values (inductances or capacitances) are connected to the first and second high-frequency input/output terminals and the first and second matching terminals, and on/off control is performed for the first, second, and third switch devices.

19 Claims, 15 Drawing Sheets

FIG. 5A 101:ON,102:OFF,103:OFF
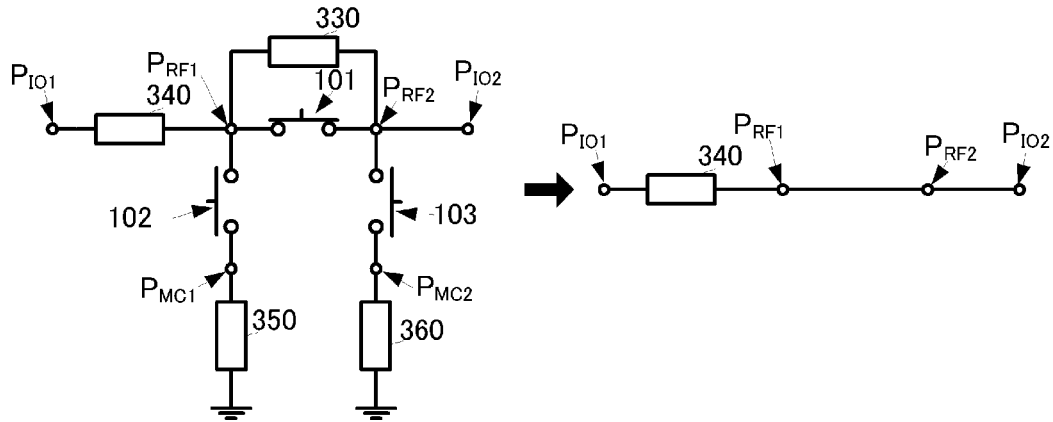
FIG. 5B 101:ON,102:ON,103:OFF
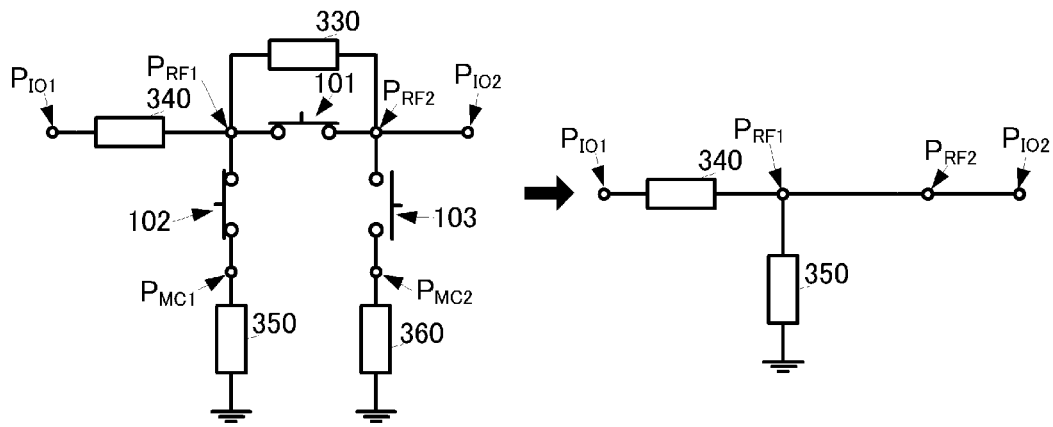
FIG. 5C 101:ON,102:ON,103:ON
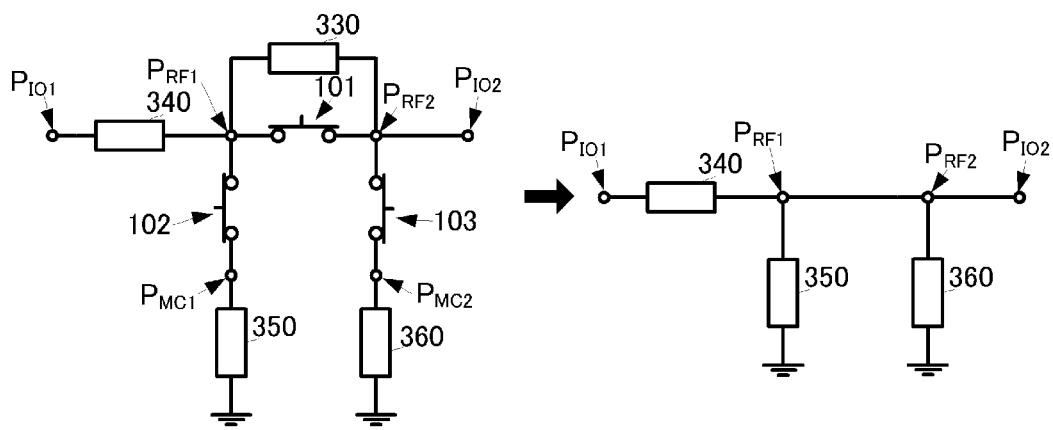

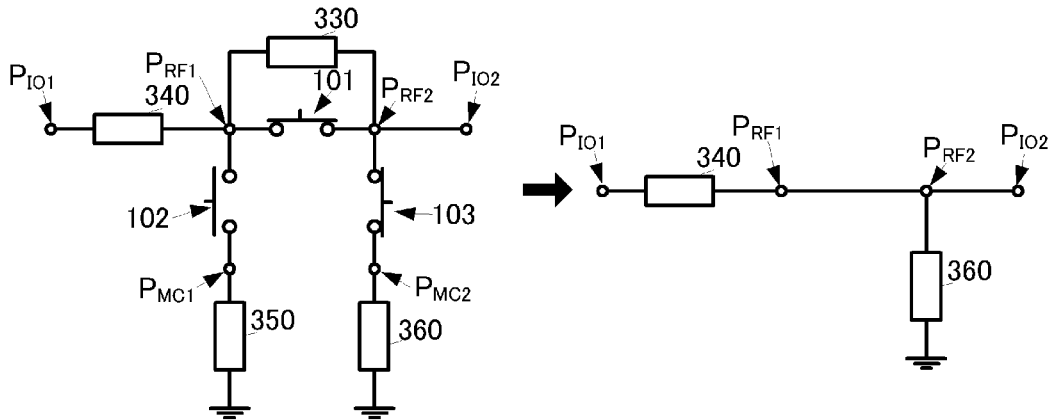
FIG. 6D 101:ON,102:OFF,103:ON
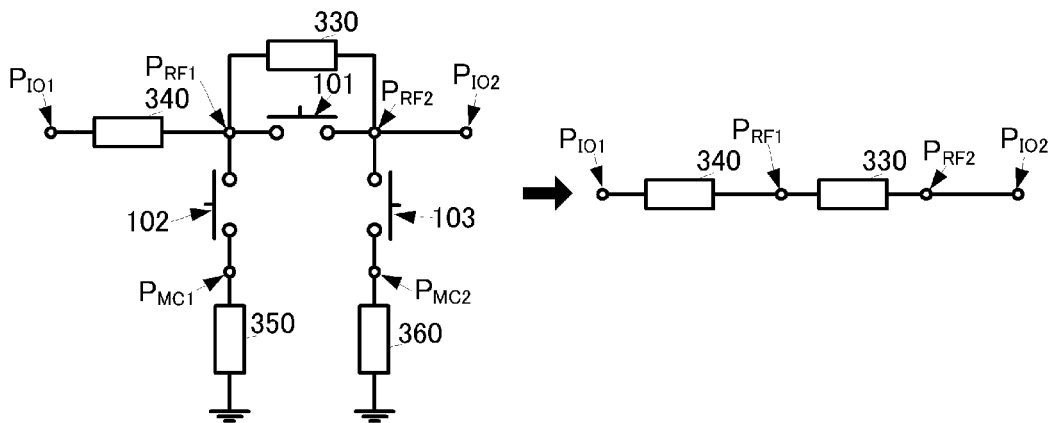
FIG. 6E 101:OFF,102:OFF,103:OFF
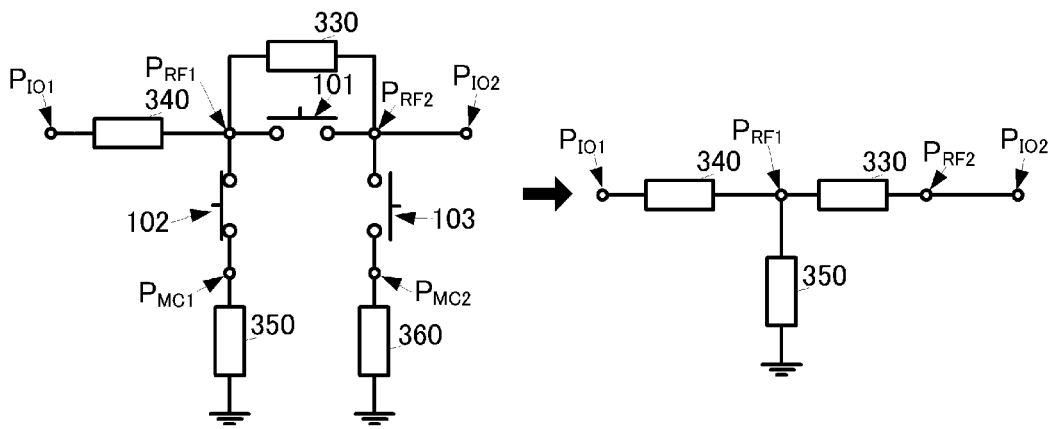
FIG. 6F 101:OFF,102:ON,103:OFF

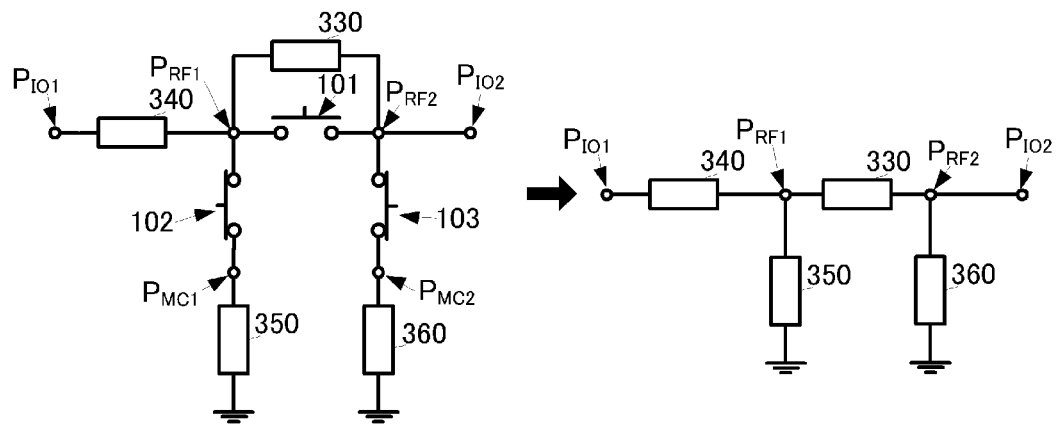
FIG. 7G 101:OFF, 102:ON, 103:ON
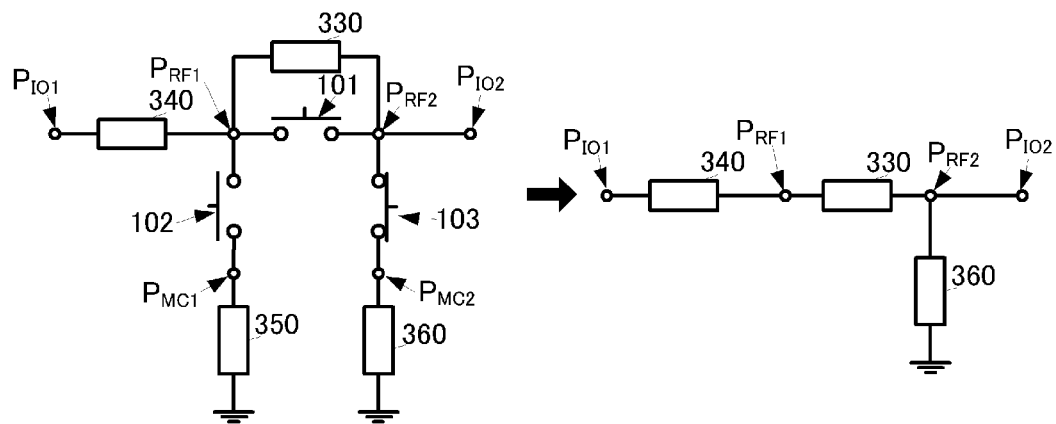
FIG. 7H 101:OFF, 102:OFF, 103:ON

IMPEDANCE MATCHING SWITCH CIRCUIT, IMPEDANCE MATCHING SWITCH CIRCUIT MODULE, AND IMPEDANCE MATCHING CIRCUIT MODULE

BACKGROUND OF THE INVENTION

1. Field of the Invention

The present invention relates to impedance matching circuit modules configured to perform impedance matching between an antenna and a high-frequency front end unit, and also relates to impedance matching switch circuit modules included in the impedance matching circuit modules.

2. Description of the Related Art

Wireless communication terminals, such as cellular phones, include an antenna for transmitting/receiving high-frequency signals to/from the outside and a high-frequency front end unit for performing transmission processing and reception processing for high-frequency signals. If impedance matching is not performed between the antenna and high-frequency front end unit in the frequency band of transmitted/received high-frequency signals, the high-frequency signals cannot be transmitted between the antenna and the high-frequency front end unit with a low loss. Thus, in general, an impedance matching circuit is arranged between the antenna and the high-frequency front end unit. In other words, the antenna is connected to the front end unit through the impedance matching circuit.

In recent years, the frequency band of an antenna and a high-frequency front end unit has been increasingly widened and the antenna and the high-frequency front end unit are capable of supporting a plurality of bands (communication frequency bands) within this wide frequency band. However, an impedance matching circuit defined by a fixed circuit pattern including only inductors and capacitors allows impedance matching to be performed in a limited frequency band and, thus, it is not easy to achieve low-loss transmission of high-frequency signals in the above-described plurality of bands.

Accordingly, in the high-frequency module (referred to as an antenna device in Japanese Unexamined Patent Application Publication No. 2003-179426) disclosed in Japanese Unexamined Patent Application Publication No. 2003-179426, an LC resonant circuit is connected to or disconnected from an antenna in accordance with a transmission/reception band, and low-loss transmission of high-frequency signals in two different bands is realized by selectively using this LC resonant circuit.

However, in the high-frequency module disclosed in Japanese Unexamined Patent Application Publication No. 2003-179426, widening of a band cannot be achieved by using a single LC resonant circuit since there is an influence from the band pass characteristics of the LC resonant circuit. Thus, when the frequency bands are spaced apart from each other, an LC resonant circuit needs to be provided for each of the bands in which the antenna and the front end unit perform transmission and reception. The number of switching terminals varies in accordance with the number of the LC resonant circuits. Thus, when the number of utilized bands is increased due to widening of a band (wider frequency band), the number of the LC resonant circuits and the number of the switching terminals of the switches are increased, which results in an increase in the size of the high-frequency module. In other words, it is not easy to reduce a device size while still supporting a wide band. Further, the circuit constants of the LC circuit need to be adjusted in accordance with the utilized band whenever the utilized band changes and, thus, the specifications of the switch need to be changed, making it difficult to change the design.

SUMMARY OF THE INVENTION

Preferred embodiments of the present invention provide an impedance matching circuit module which has a simple configuration and supports the configuration specifications for various bands and achieves impedance matching in each band even when the utilized frequency bands are widened. In addition, preferred embodiments of the present invention provide an impedance matching switch circuit module included in an impedance matching circuit module.

According to a preferred embodiment of the present invention, an impedance matching switch circuit includes a first high-frequency input/output terminal and a second high-frequency input/output terminal defining as input/output terminals for a high-frequency signal, a first matching terminal configured to be connected to an external matching element, a first switch device, and a second switch device. The first switch device is connected between the first high-frequency input/output terminal and the second high-frequency input/output terminal. The second switch device is connected between a first high-frequency input/output terminal side of the first switch device or a second high-frequency input/output terminal side of the first switch device and the first matching terminal.

With this configuration, an L-type switch circuit is provided. Further, with this configuration, in accordance with a manner in which matching elements are externally connected and through on/off control of the first and second switch devices, impedance characteristics are significantly changed. As a result, wide range impedance matching is achieved.

It is preferable that the impedance matching switch circuit according to a preferred embodiment of the present invention has the following configuration. The impedance matching switch circuit further includes a second matching terminal configured to be connected to a matching element that is different from the external matching element connected to the first matching terminal, and a third switch device. The third switch device is connected between the second matching terminal and a side of the first switch device not connected to the second switch device.

With this configuration, a π-type switch circuit is provided. Further, with this configuration, in accordance with a manner in which matching elements are externally connected and through on/off control of the first, second, and third switch devices, impedance characteristics are further changed. As a result, wider range impedance matching is achieved.

An impedance matching switch circuit module according to a preferred embodiment of the present invention includes a circuit configuration of the above-described impedance matching switch circuit including the first and second switch devices and has the following configuration. The impedance matching switch circuit module includes a switch IC and a base body. The switch IC includes the first switch device and the second switch device provided therein. The base body is preferably rectangular or substantially rectangular, and the switch IC is mounted on a front surface of the base body, and the first high-frequency input/output terminal, the second high-frequency input/output terminal, the first matching terminal, and a plurality of terminals configured to perform driving control of the switch IC are provided on the back surface of the base body. A first group including the first high-frequency input/output terminal and the second high-frequency input/output terminal, a second group including the first matching terminal, and a third group including the plurality of terminals configured to perform driving control of the switch IC are arranged in a first direction of the back surface. The first group and the second group are adjacent to each other in the first direction.

It is preferable that an impedance matching circuit module according to a preferred embodiment of the present invention have the following configuration. The impedance matching circuit module includes a mounting substrate on which the base body is mounted. The mounting substrate includes first, second, and third conductor patterns and first and second matching element mounting regions. The first conductor pattern connects the first high-frequency input/output terminal to a first external connection terminal. The second conductor pattern connects the second high-frequency input/output terminal to a second external connection terminal arranged so as to be opposed to the first external connection terminal with the base body therebetween. The third conductor pattern is connected to the first matching terminal. A first matching element mounting region is provided between the first conductor pattern and the second conductor pattern. A second matching element mounting region is provided between the third conductor pattern and the first conductor pattern or a conductor pattern connected to the second conductor pattern or to ground.

These configurations illustrate the specific preferred shapes of the impedance matching switch circuit module that includes an impedance matching switch circuit including the circuit configurations described above and the impedance matching circuit module including the impedance matching switch circuit module. By including these configurations, a small impedance matching switch circuit module and a small impedance matching circuit module are provided. Further, since the first and second high-frequency input/output terminals are adjacent to the first matching terminal, transmission loss is reduced.

In the impedance matching circuit module according to a preferred embodiment of the present invention, it is preferable that a matching element be selectively mounted in the first matching element mounting region and the second matching element mounting region.

With this configuration, impedance matching has already been performed in the present impedance matching circuit module. Thus, impedance matching between external circuits connected through the impedance matching circuit module is performed by simply mounting the impedance matching circuit module.

An impedance matching switch circuit module according to a preferred embodiment of the present invention includes the above-described impedance matching switch circuit including the first, second, and third switch devices, and has the following configuration. The impedance matching switch circuit module includes a switch IC and a base body. The switch IC includes the first switch device, the second switch device, and the third switch device provided therein. The base body is preferably rectangular or substantially rectangular. The switch IC is mounted on a front surface of the base body, and the first high-frequency input/output terminal, the second high-frequency input/output terminal, the first matching terminal, the second matching terminal, and a plurality of terminals configured to perform driving control of the switch IC are provided on the back surface of the base body. A first group including the first high-frequency input/output terminal and the second high-frequency input/output terminal, a second group including the first matching terminal and the second matching terminal, and a third group including the plurality of terminals configured to perform driving control of the switch IC are arranged in a first direction of the back surface. The first group and the second group are adjacent to each other in the first direction.

In the impedance matching switch circuit module according to a preferred embodiment of the present invention, an order in which the first high-frequency input/output terminal and the second high-frequency input/output terminal in the first group are arranged may be identical to an order in which the first matching terminal and the second matching terminal in the second group are arranged, in a second direction perpendicular or substantially perpendicular to the first direction.

It is preferable that an impedance matching circuit module according to a preferred embodiment of the present invention has the following configuration. The impedance matching circuit module includes a mounting substrate on which the base body is mounted, and the mounting substrate includes first, second, third, and fourth conductor patterns and first, second, and fourth matching element mounting regions. The first conductor pattern connects the first high-frequency input/output terminal to a first external connection terminal. The second conductor pattern connects the second high-frequency input/output terminal to a second external connection terminal arranged so as to be opposed to the first external connection terminal with the base body therebetween. The third conductor pattern is connected to the first matching terminal. The fourth conductor pattern is connected to the second matching terminal. The first matching element mounting region is provided between the first conductor pattern and the second conductor pattern. The second matching element mounting region is provided between the third conductor pattern and the first conductor pattern or a conductor pattern connected to ground. The fourth matching element mounting region is provided between the fourth conductor pattern and a conductor pattern connected to ground.

In the impedance matching switch circuit module according to a preferred embodiment of the present invention, an order in which the first high-frequency input/output terminal and the second high-frequency input/output terminal in the first group are arranged may be reverse to an order in which the first matching terminal and the second matching terminal in the second group are arranged, in a second direction perpendicular or substantially perpendicular to the first direction.

It is preferable that an impedance matching circuit module according to a preferred embodiment of the present invention have the following configuration. The impedance matching circuit module includes a mounting substrate on which the base body is mounted, and the mounting substrate includes first, second, third, and fourth conductor patterns and first, second, and fourth impedance matching element mounting regions. The first conductor pattern connects the first high-frequency input/output terminal to a first external connection terminal. The second conductor pattern connects the second high-frequency input/output terminal to a second external connection terminal arranged so as to be opposed to the first external connection terminal with the base body therebetween. The third conductor pattern is connected to the first matching terminal. The fourth conductor pattern is connected to the second matching terminal. The first matching element mounting region is provided between the first conductor pattern and the second conductor pattern. The fourth matching element mounting region is provided between the third conductor pattern and the second conductor pattern or a conductor pattern connected to ground. The second matching element mounting region is provided between the fourth conductor pattern and the first conductor pattern or a conductor pattern connected to ground.

These configurations illustrate the specific shapes of the impedance matching switch circuit module including the circuit configurations described above and the impedance matching circuit module including the impedance matching switch circuit module. By including these configurations, a small impedance matching switch circuit is achieved. Further, since the first and second high-frequency input/output terminals are adjacent to the first and second matching terminals, transmission loss is reduced. In addition, by making the positional relationship between the first and second high-frequency input/output terminals be the same as or reverse to the positional relationship between the first and second matching terminals, impedance matching is performed in a wider frequency band.

In the impedance matching circuit module according to a preferred embodiment of the present invention, it is preferable that a matching element be selectively mounted in the first matching element mounting region, the second matching element mounting region, and the fourth matching element mounting region.

With this configuration, impedance matching has already been performed in the present impedance matching circuit module. Thus, impedance matching between external circuits connected through the impedance matching circuit module is performed by simply mounting the impedance matching circuit module.

In the impedance matching circuit module according to a preferred embodiment of the present invention, it is preferable that a third matching element mounting region be provided at a mid-point on the first conductor pattern, and a matching element be mounted in the third matching element mounting region.

With this configuration, impedance matching is performed in a still wider frequency band.

In the impedance matching switch circuit module according to a preferred embodiment of the present invention, it is preferable that the second group include a ground connection terminal connected to ground, and the ground connection terminal be disposed at a position between the first matching terminal and the second matching terminal.

With this configuration, isolation between the first matching terminal and the second matching terminal is ensured. As a result, impedance matching is performed more accurately.

Various preferred embodiments of the present invention provide a small impedance matching circuit module which has a simple configuration and supports the configuration specifications for various bands and achieves impedance matching in each band even when the utilized frequency bands are widened.

The above and other elements, features, steps, characteristics and advantages of the present invention will become more apparent from the following detailed description of the preferred embodiments with reference to the attached drawings.

BRIEF DESCRIPTION OF THE DRAWINGS

FIGS. 5A to 5C are diagrams illustrating circuit variations of the impedance matching circuit module according to a preferred embodiment of the present invention.

FIGS. 6D to 6F are diagrams illustrating circuit variations of the impedance matching circuit module according to a preferred embodiment of the present invention.

FIGS. 7G and 7H are diagrams illustrating circuit variations of the impedance matching circuit module according to a preferred embodiment of the present invention.

DETAILED DESCRIPTION OF THE PREFERRED EMBODIMENTS

An impedance matching switch circuit module and an impedance matching circuit module according to a first preferred embodiment of the present invention will be described with reference to the accompanying drawings.

Figure 1:
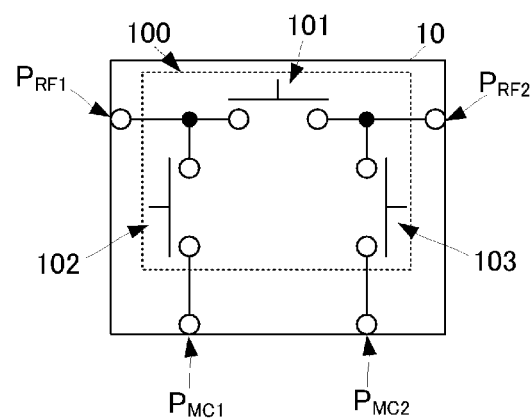
FIG. 1 is an equivalent circuit diagram of an impedance matching switch circuit module according to a first preferred embodiment of the present invention.
Figure 2A:
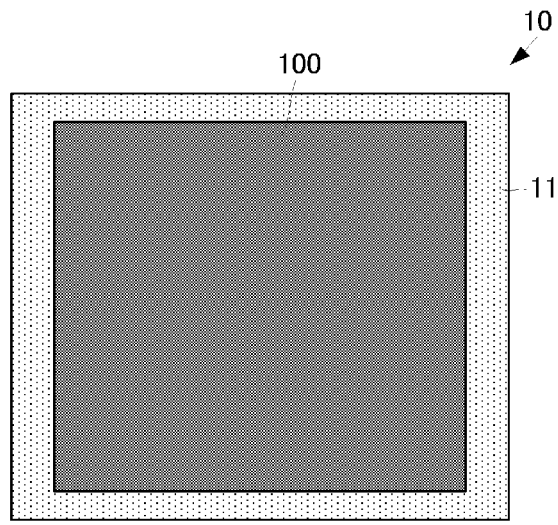
FIGS. 2A to 2C illustrate external views of the impedance matching switch circuit module according to the first preferred embodiment of the present invention.
Figure 2B:
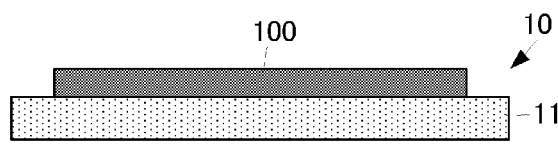
Figure 2C:
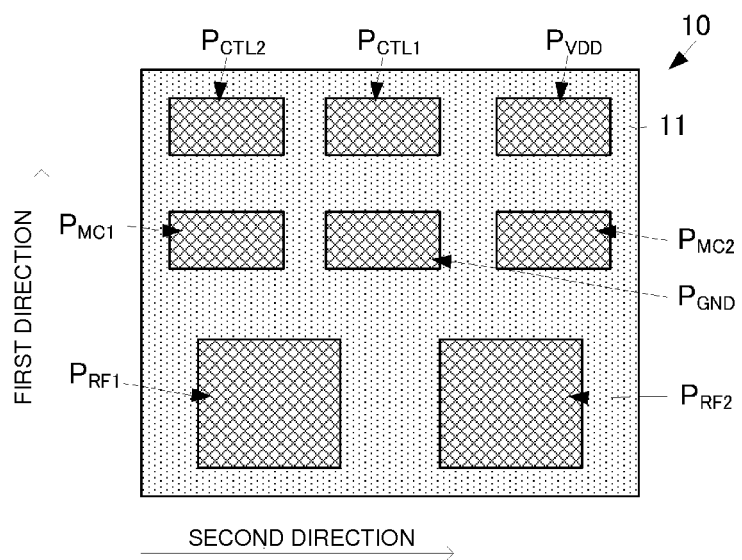

FIG. 1 illustrates an equivalent circuit of the impedance matching switch circuit module according to the first preferred embodiment of the present invention. FIGS. 2A to 2C illustrate external views of the impedance matching switch circuit module according to the first preferred embodiment of the present invention.

Referring to FIG. 1, from the viewpoint of the configuration of a circuit, an impedance matching switch circuit module 10 includes a π-type circuit including a first switch device 101, a second switch device 102, and a third switch device 103. The first, second, and third switch devices 101, 102, and 103 are preferably SPST (Single-Pole, Single-Throw) switches, for example, which are controlled so as to be in an on state (conducting state) or an off state (open state). The first, second, and third switch devices 101, 102, and 103 are activated by an external driving voltage $V_{DD}$ and are controlled so as to be on or off in accordance with the combination of the Hi/Low levels of control voltage signals $V_{CTL1}$ and $V_{CTL2}$.

One end of the first switch device 101 is connected to a first high-frequency input/output terminal $P_{RF1}$. The other end of the first switch device 101 is connected to a second high-frequency input/output terminal $P_{RF2}$. When the first switch device 101 is turned on, the first high-frequency input/output terminal $P_{RF1}$ is electrically directly connected to the second high-frequency input/output terminal $P_{RF2}$ through the first switch device 101. When the first switch device 101 is turned off, the first and second high-frequency input/output terminals $P_{RF1}$ and $P_{RF2}$ are electrically disconnected from each other.

One end of the second switch device 102 is connected to the first high-frequency input/output terminal $P_{RF1}$. The other end of the second switch device 102 is connected to a first matching terminal $P_{MC1}$. When the second switch device 102 is turned on, the first high-frequency input/output terminal $P_{RF1}$ is electrically directly connected to the first matching terminal $P_{MC1}$ through the second switch device 102. When the second switch device 102 is turned off, the first high-frequency input/output terminal $P_{RF1}$ and the first matching terminal $P_{MC1}$ are electrically disconnected from each other.

One end of the third switch device 103 is connected to the second high-frequency input/output terminal $P_{RF2}$. The other end of the third switch device 103 is connected to a second matching terminal $P_{MC2}$. When the third switch device 103 is turned on, the second high-frequency input/output terminal $P_{RF2}$ is electrically directly connected to the second matching terminal $P_{MC2}$ through the third switch device 103. When the third switch device 103 is turned off, the second high-frequency input/output terminal $P_{RF2}$ and the second matching terminal $P_{MC2}$ are electrically disconnected from each other.

Matching elements, such as inductors and capacitors, for example, having appropriately set element values (inductances or capacitances) are connected to the first and second high-frequency input/output terminals $P_{RF1}$ and $P_{RF2}$ and the first and second matching terminals $P_{MC1}$ and $P_{MC2}$ of the impedance matching switch circuit module 10 including the circuit configuration described above. Note that specific examples of connection configurations will be described later. With this configuration, impedance matching is appropriately performed at a desired matching frequency between circuit units for which impedance matching is to be performed and which are connected to each other through the first and second high-frequency input/output terminals $P_{RF1}$ and $P_{RF2}$.

Specifically, the manners in which matching elements (inductors and capacitors) are connected and the element values of the matching elements are changed and, further, the on/off states of the first, second, and third switch devices 101, 102, and 103 are changed. As a result, the circuit configuration of the impedance matching switch circuit module 101 is changed and the impedance characteristics (phase characteristics, for example) of the circuit are changed. As a result, desired impedance characteristics at a frequency at which impedance matching is to be performed are achieved, and impedance matching between circuit units for which impedance matching is to be performed and which are connected to each other through the first and second high-frequency input/output terminals $P_{RF1}$ and $P_{RF2}$ is achieved. Since this impedance matching is achieved by a simple circuit configuration defined by the impedance matching switch circuit module 10 having the above-described simple circuit configuration and matching elements connected thereto, impedance matching is achieved using a simple circuit.

Referring to FIGS. 2A to 2B, from a structural viewpoint, the impedance matching switch circuit module 10 includes a base body 11 and a switch IC 100.

The switch IC 100 includes the first, second, and third switch devices 101, 102, and 103. The switch IC 100 is preferably configured using, for example, an SOI (Silicon-On-Insulator) technology.

The base body 11 is preferably made of a rectangular or substantially rectangular insulating material, for example, and conductor patterns are provided inside the base body 11 and on the front and back surfaces of the base body 11. The first and second high-frequency input/output terminals $P_{RF1}$ and $P_{RF2}$, terminal conductors for the first and second matching terminals $P_{MC1}$ and $P_{MC2}$, a terminal conductor for a ground terminal $P_{GND}$, a terminal conductor for a driving voltage application terminal $P_{VDD}$, and terminal conductors for control voltage application terminals $P_{CTL1}$ and $P_{CTL2}$ are provided on the back surface of the base body 11.

These terminal conductors are disposed in three land groups arranged in a first direction of the rectangular or substantially rectangular shape in plan view. The terminal conductors for the first and second high-frequency input/output terminals $P_{RF1}$ and $P_{RF2}$ are in the first group, the terminal conductors for the first and second matching terminals $P_{MC1}$ and $P_{MC2}$ and the terminal conductor for the ground terminal $P_{GND}$ are in the second group, and the terminal conductor for the driving voltage application terminal $P_{VDD}$ and the terminal conductors for the control voltage application terminals $P_{CTL1}$ and $P_{CTL2}$ are in the third group. The terminals in the first group are arranged near one end in the first direction, and the terminals in the third group are arranged near the other end in the first direction. The terminals in the second group are arranged substantially in the middle in the first direction.

The terminal conductors for the first and second high-frequency input/output terminals $P_{RF1}$ and $P_{RF2}$, which are in the first group, are arranged in a second direction. The terminal electrode for the first high-frequency input/output terminal $P_{RF1}$ is arranged near one end in the second direction and the terminal electrode for the second high-frequency input/output terminal $P_{RF2}$ is arranged near the other end in the second direction.

The terminal conductors for the first and second matching terminals $P_{MC1}$ and $P_{MC2}$ and the terminal conductor for the ground terminal $P_{GND}$, which are in the second group, are arranged in the second direction. The terminal conductor for the first matching terminal $P_{MC1}$ is arranged near one end in the second direction, and the terminal conductor for the second matching terminal $P_{MC2}$ is arranged near the other end in the second direction. The terminal conductor for the ground terminal $P_{GND}$ is arranged between terminal conductors for the first and second matching terminals $P_{MC1}$ and $P_{MC2}$ in the second direction.

The terminal conductors for the driving voltage application terminal $P_{VDD}$ and the control voltage application terminals $P_{CTL1}$ and $P_{CTL2}$, which are in the third group, are arranged in the second direction with a predetermined distance between adjacent terminal conductors.

The base body 11 includes conductor patterns for connecting the first, second, and third switch devices 101, 102, and 103, the first and second high-frequency input/output terminals $P_{RF1}$ and $P_{RF2}$, and the first and second matching terminals $P_{MC1}$ and $P_{MC2}$ arranged such that the circuit illustrated in FIG. 1 is achieved. Further, although not illustrated, the base body 11 also includes conductor patterns configured such that the terminal conductor for the ground terminal $P_{GND}$, the terminal conductor for the driving voltage application terminal $P_{VDD}$, and the terminal conductors for the control voltage application terminals $P_{CTL1}$ and $P_{CTL2}$ function as designed.

By including such a configuration, the small impedance matching switch circuit module 10 including only the switch IC 100 and the base body 11 is achieved.

By including the configuration of the terminals described above, no other terminals exist between the terminal conductors for the first and second high-frequency input/output terminals $P_{RF1}$ and $P_{RF2}$, and a transmission path between the terminal conductors for the first and second matching terminals $P_{MC1}$ and $P_{MC2}$ connected through the first switch device 101 is shortened, such that isolation from other transmission paths is ensured.

No other terminals exist between the terminal conductor for the first high-frequency input/output terminal $P_{RF1}$ and the terminal conductor for the first matching terminal $P_{MC1}$, and the transmission path between the terminal conductor for the first high-frequency input/output terminal $P_{RF1}$ and the terminal conductor for the first matching terminal $P_{MC1}$ connected through the second switch device 102 is shortened, such that isolation from other transmission paths is ensured.

No other terminals exist between the terminal conductor for the second high-frequency input/output terminal $P_{RF2}$ and the terminal conductor for the second matching terminal $P_{MC2}$, and a transmission path between the terminal conductor for the second high-frequency input/output terminal $P_{RF2}$ and the terminal conductor for the second matching terminal $P_{MC2}$ connected through the third switch device 103 is shortened, such that isolation from other transmission paths is ensured.

Since the ground is arranged between the terminal conductors for the first and second matching terminals $P_{MC1}$ and $P_{MC2}$, isolation between the terminal conductors for the first and second matching terminals $P_{MC1}$ and $P_{MC2}$ is ensured.

As described above, by including the configuration of the present preferred embodiment, the impedance matching switch circuit module 10 having a small size is achieved. Since isolation between the switched terminals is ensured, impedance does not change with the state of the switch device, such that desired impedance characteristics are reliably and accurately achieved.

Figure 3:
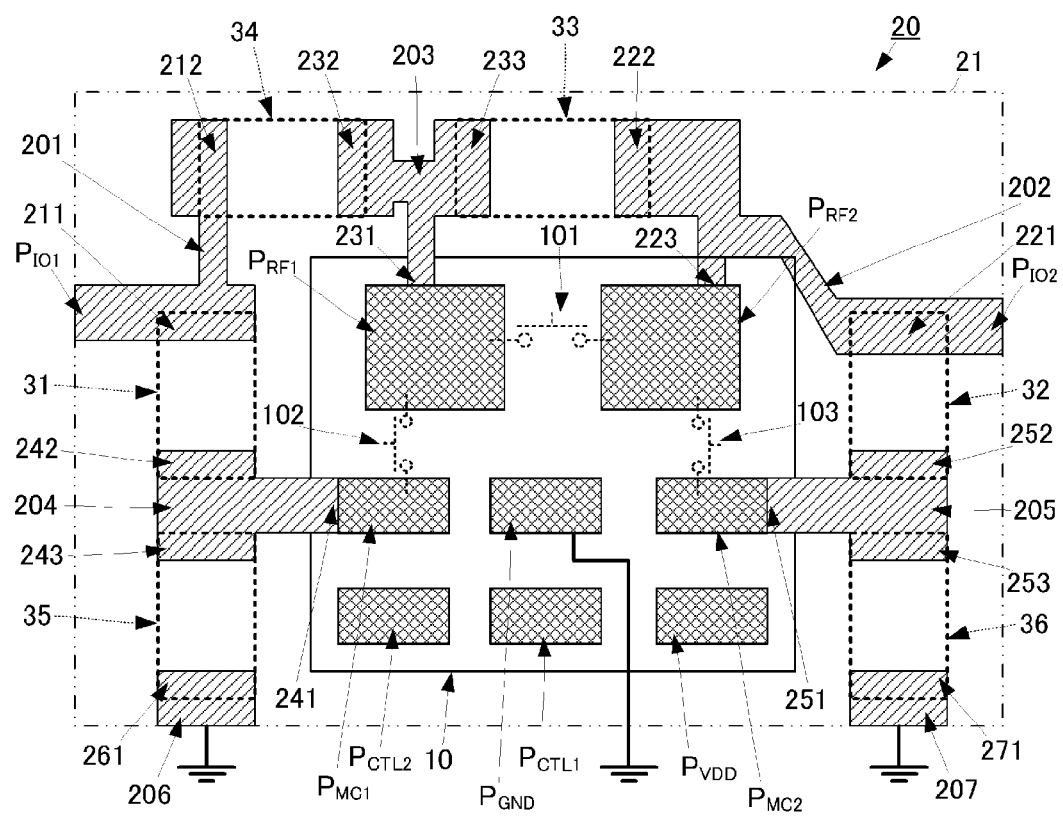
FIG. 3 is a configuration diagram illustrating a manner in which an impedance matching circuit module including the impedance matching switch circuit module according to the first preferred embodiment of the present invention is used.

The impedance matching switch circuit module 10 described above is preferably used in a configuration described below, for example. FIG. 3 is a configuration diagram illustrating a manner in which the impedance matching circuit module including the impedance matching switch circuit module according to the first preferred embodiment of the present invention is preferably used.

An impedance matching circuit module 20 includes a mounting substrate 21 and the impedance matching switch circuit module 10. On the mounting substrate 21, conductor patterns 201, 202, 203, 204, 205, 206, and 207 are provided. The conductor patterns 201, 202, 203, 204, 205, 206, and 207 are provided in a region near a mounting region in which the impedance matching switch circuit module 10 is mounted, so as to surround the mounting region.

The conductor pattern 201 corresponds to the first conductor pattern of a preferred embodiment of the present invention. One end of the conductor pattern 201 is a first external connection terminal $P_{IO1}$, and the other end includes a land conductor 212. A land conductor 211 is provided at a certain point along the conductor pattern 201 in a direction in which the conductor pattern 201 extends.

The conductor pattern 202 corresponds to the second conductor pattern of a preferred embodiment of the present invention. One end of the conductor pattern 202 is a second external connection terminal $P_{IO2}$, and the other end includes a land conductor 223. The land conductor 223 is arranged within a region in which the impedance matching switch circuit module 10 is mounted. Land conductors 221 and 222 are provided with a distance therebetween at certain points along the conductor pattern 202 in the direction in which the conductor pattern 202 extends. The land conductor 221 is closer to the second external connection terminal $P_{IO2}$ and the land conductor 222 is closer to the land conductor 223.

The conductor patterns 201 and 202 are arranged in opposing regions with the impedance matching switch circuit module 10 mounting region therebetween.

The conductor pattern 203, which corresponds to the first conductor pattern of a preferred embodiment of the present invention, is configured to connect land conductors 231, 232, and 233 to one another. The conductor pattern 203 is provided in a region which is located between the conductor pattern 201 forming region and the conductor pattern 202 mounting region and which is outside of the region in which the impedance matching switch circuit module is mounted, except for the land conductor 231 and the vicinity thereof. The land conductor 231 is arranged in the region in which the impedance matching switch circuit module is mounted. The land conductor 232 is arranged at a position facing the land conductor 212 with a predetermined distance between the land conductor 232 and the land conductor 212, such that a matching element mounting region is provided. The matching element mounting region 34 corresponds to the third matching element mounting region of a preferred embodiment of the present invention. The land conductor 233 is arranged at a position facing the land conductor 222 with a predetermined distance between the land conductor 233 and the land conductor 222, such that a matching element mounting region 33 is provided. The matching element mounting region 33 corresponds to the first matching element mounting region of a preferred embodiment of the present invention. These distances are each determined on the basis of the distance between the external terminals of a matching element.

The conductor patterns 206 and 207 are connected to a ground potential and respectively include ground conductors 261 and 271. The conductor patterns 206 and 207 are arranged in opposing regions with the impedance matching switch circuit module 10 mounting region therebetween.

The conductor pattern 204, which corresponds to the third conductor pattern of a preferred embodiment of the present invention, is configured to connect land conductors 241, 242, and 243 to one another. The conductor pattern 204 is provided in a region which is located between the conductor pattern 201 formation region and the conductor pattern 206 formation region and which is outside of the region in which the impedance matching switch circuit module is mounted, except for the land conductor 241 and the vicinity thereof. The land conductor 242 is arranged at a position facing the land conductor 211 with a predetermined distance between the land conductor 242 and the land conductor 211, such that a matching element mounting region 31 is provided. The land conductor 243 is arranged at a position facing the ground conductor 261 with a predetermined distance between the land conductor 243 and the ground conductor 261, such that a matching element mounting region 35 is provided. The matching element mounting regions 31 and 35 correspond to the second matching element mounting regions. These distances are each determined on the basis of the distance between the external terminals of a matching element.

The conductor pattern 205, which corresponds to the fourth conductor pattern of a preferred embodiment of the present invention, is configured to connect land conductors 251, 252, and 253. The conductor pattern 205 is provided in a region which is located between the conductor pattern 202 formation region and the conductor pattern 207 formation region and which is outside of the region where the impedance matching switch circuit module 10 is mounted, except for the land conductor 251 and the vicinity thereof. The land conductor 252 is arranged at a position facing the land conductor 221 with a predetermined distance between the land conductor 252 and the land conductor 221, such that a matching element mounting region 32 is provided. The land conductor 253 is arranged at a position facing the ground conductor 271 with a predetermined distance between the land conductor 253 and the ground conductor 271, such that a matching element mounting region 36 is provided. The matching element mounting regions 32 and 36 correspond to the fourth matching element mounting regions. These distances are each determined on the basis of the distance between the external terminals of a matching element.

The impedance matching switch circuit module 10 is mounted on the conductor pattern formation surface of the mounting substrate 21. The terminals of the impedance matching switch circuit module 10 are mounted as follows. The terminal conductor for the first high-frequency input/output terminal $P_{RF1}$ comes into contact with the land conductor 231. The terminal conductor for the second high-frequency input/output terminal $P_{RF2}$ comes into contact with the land conductor 223. The terminal conductor for the first matching terminal $P_{MC1}$ comes into contact with the land conductor 241. The terminal conductor for the second matching terminal $P_{MC2}$ comes into contact with the land conductor 251.

By mounting matching elements having desired element values in appropriate regions among the matching element mounting regions 31 to 36 having the configurations described above, the impedance matching circuit module 20 achieves a desired impedance.

Figure 4A:
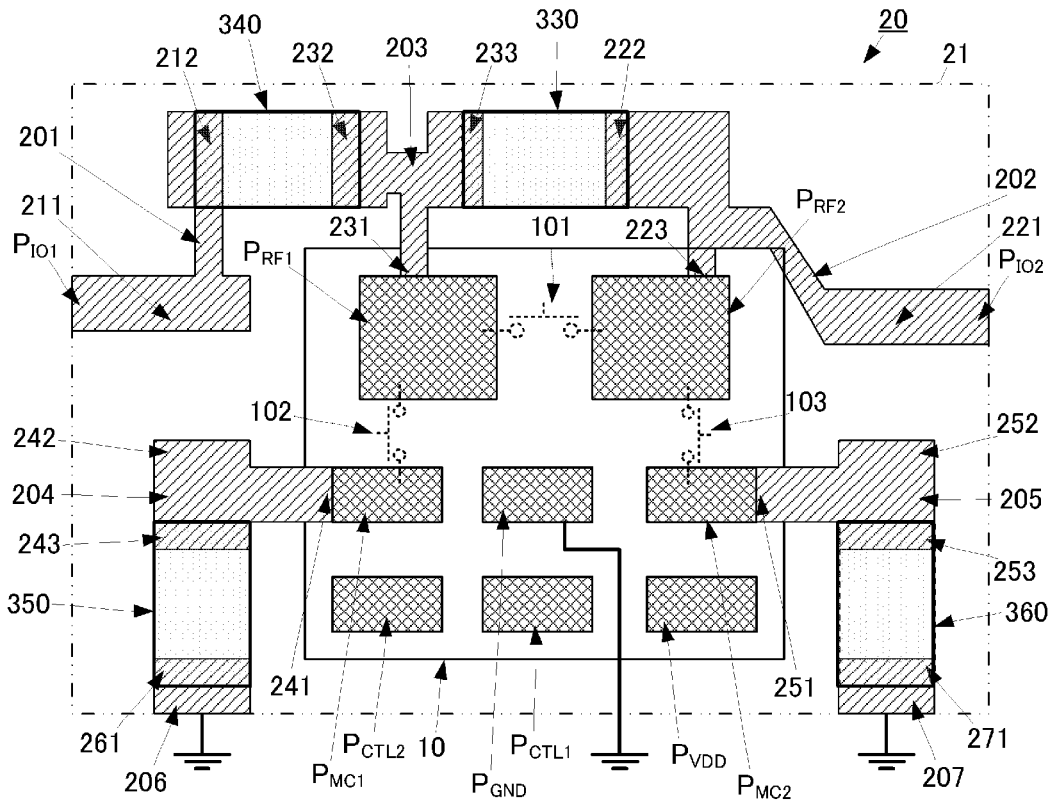
FIGS. 4A and 4B are diagrams illustrating an example of using the impedance matching circuit module according to the first preferred embodiment of the present invention.
Figure 4B:
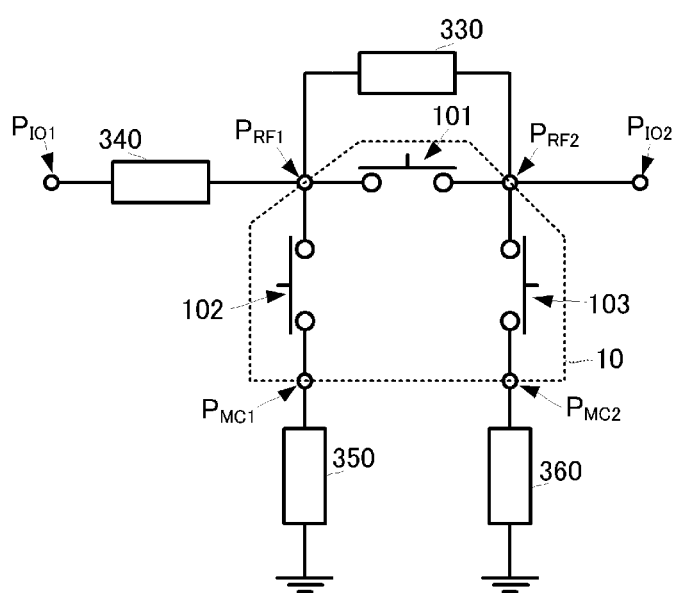

Specific usage examples will now be described. FIGS. 4A and 4B are diagrams illustrating an example of using the impedance matching circuit module according to the first preferred embodiment of the present invention. FIG. 4A is a configuration diagram, and FIG. 4B is an equivalent circuit diagram. Note that the configuration illustrated in FIGS. 4A and 4B is an example, and regarding a configuration other than the configuration in which a matching element 340 or a resistor element having 0Ω or approximately 0Ω is mounted in the matching element mounting region 34, any appropriately selected matching elements may be mounted so as to achieve a desired impedance. The matching elements are surface mount elements, which preferably may each be an inductor or capacitor, for example, and the element value (inductance or capacitance) may be appropriately selected so as to achieve a desired impedance.

A matching element 330 is mounted in the matching element mounting region 33, such that the conductor patterns 202 and 203 are connected to each other through the matching element 330. A matching element 340 is mounted in the matching element mounting region 34, and the conductor patterns 201 and 203 are connected to each other through the matching element 340. A matching element 350 is mounted in the matching element mounting region 35, and the conductor patterns 204 and 206 are connected to each other through the matching element 350.

A matching element 360 is mounted in the matching element mounting region 36, and the conductor patterns 205 and 207 are connected to each other through the matching element 360.

By including the configuration described above, the impedance matching circuit module 20 has a circuit configuration illustrated in FIG. 4B. Specifically, the first external connection terminal $P_{IO1}$ and the first high-frequency input/output terminal $P_{RF1}$ are connected to each other through the matching element 340. The first high-frequency input/output terminal $P_{RF1}$ and the second high-frequency input/output terminal $P_{RF2}$ are connected to each other through a parallel circuit including the first switch device 101 and the matching element 330. As a result, the first external connection terminal $P_{IO1}$ and the second external connection terminal $P_{IO2}$ are connected to each other through a series circuit including the matching element 340 and a parallel circuit including the first switch device 101 and the matching element 330.

The first matching terminal $P_{MC1}$ is connected to a ground potential through the matching element 350. As a result, the first high-frequency input/output terminal $P_{RF1}$ is connected to the ground potential through a series circuit including the second switch device 102 and the matching element 350. The second matching terminal $P_{MC2}$ is connected to the ground potential through the matching element 360. As a result, the second high-frequency input/output terminal $P_{RF2}$ is connected to the ground potential through a series circuit including the third switch device 103 and the matching element 360.

By performing on/off control of the first, second, and third switch devices 101, 102, and 103, in the circuit configuration described above, the following circuits are provided as shown below. FIGS. 5A to 7H illustrate the circuit variations of the impedance matching circuit module, each illustrating a circuit configuration including the switch states and an equivalent circuit.

In FIG. 5A, the first switch device 101 is on and the second and third switch devices 102 and 103 are off.

In this case, the first high-frequency input/output terminal $P_{RF1}$ and the second high-frequency input/output terminal $P_{RF2}$ are electrically connected to each other. The first high-frequency input/output terminal $P_{RF1}$ and the first matching terminal $P_{MC1}$ (matching element 350) are electrically disconnected from each other, and the second high-frequency input/output terminal $P_{RF2}$ and the second matching terminal $P_{MC2}$ (matching element 360) are electrically disconnected from each other.

As a result, the circuit of the impedance matching circuit module 20 becomes a circuit in which the first external connection terminal $P_{IO1}$ is connected to the second external connection terminal $P_{IO2}$ through the matching element 340.

In FIG. 5B, the first and second switch devices 101 and 102 are on and the third switch device 103 is off.

In this case, the first high-frequency input/output terminal $P_{RF1}$ and the second high-frequency input/output terminal $P_{RF2}$ are electrically connected to each other. The first high-frequency input/output terminal $P_{RF1}$ and the first matching terminal $P_{MC1}$ (matching element 350) are electrically connected to each other. The second high-frequency input/output terminal $P_{RF2}$ and the second matching terminal $P_{MC2}$ (matching element 360) are electrically disconnected from each other.

As a result, the circuit of the impedance matching circuit module 20 becomes a circuit (L-type matching circuit) in which the first external connection terminal $P_{IO1}$ and the second external connection terminal $P_{IO2}$ are connected to each other through the matching element 340, and a connection node between the second external connection terminal $P_{IO2}$ and the matching element 340 is connected to the ground through the matching element 350.

In FIG. 5C, the first, second, and third switch devices 101, 102, and 103 are on.

In this case, the first high-frequency input/output terminal $P_{RF1}$ and the second high-frequency input/output terminal $P_{RF2}$ are electrically connected to each other. The first high-frequency input/output terminal $P_{RF1}$ and the first matching terminal $P_{MC1}$ (matching element 350) are electrically connected to each other. The second high-frequency input/output terminal $P_{RF2}$ and the second matching terminal $P_{MC2}$ (matching element 360) are electrically connected to each other.

As a result, the circuit of the impedance matching circuit module 20 becomes a circuit (L-type matching circuit) in which the first external connection terminal $P_{IO1}$ and the second external connection terminal $P_{IO2}$ are connected to each other through the matching element 340 and connection node between the second external connection terminal $P_{IO2}$ and the matching element 340 are respectively connected to the ground through the matching elements 350 and 360.

In FIG. 6D, the first and third switch devices 101 and 103 are on, and the second switch device 102 is off.

In this case, the first high-frequency input/output terminal $P_{RF1}$ and the second high-frequency input/output terminal $P_{RF2}$ are electrically connected to each other. The first high-frequency input/output terminal $P_{RF1}$ and the first matching terminal $P_{MC1}$ (matching element 350) are electrically disconnected from each other. The second high-frequency input/output terminal $P_{RF2}$ and the second matching terminal $P_{MC2}$ (matching element 360) are electrically connected to each other.

As a result, the circuit of the impedance matching circuit module 20 becomes a circuit (L-type matching circuit) in which the first external connection terminal $P_{IO1}$ and the second external connection terminal $P_{IO2}$ are connected to each other through the matching element 340, and a connection node between the second external connection terminal $P_{IO2}$ and the matching element 340 is connected to the ground through the matching element 360.

In FIG. 6E, the first, second, and third switch devices 101, 102, and 103 are off.

In this case, the first high-frequency input/output terminal $P_{RF1}$ and the second high-frequency input/output terminal $P_{RF2}$ are electrically connected to each other through the matching element 330. The first high-frequency input/output terminal $P_{RF1}$ and the first matching terminal $P_{MC1}$ (matching element 350) are electrically disconnected from each other. The second high-frequency input/output terminal $P_{RF2}$ and the second matching terminal $P_{MC2}$ (matching element 360) are electrically disconnected from each other.

As a result, the circuit of the impedance matching circuit module 20 becomes a circuit in which the first external connection terminal $P_{IO1}$ and the second external connection terminal $P_{IO2}$ are connected to each other through a series circuit including the matching elements 330 and 340.

In FIG. 6F, the first and third switch devices 101 and 103 are off and the second switch device 102 is on.

In this case, the first high-frequency input/output terminal $P_{RF1}$ and the second high-frequency input/output terminal $P_{RF2}$ are electrically connected to each other through the matching element 330. The first high-frequency input/output terminal $P_{RF1}$ and the first matching terminal $P_{MC1}$ (matching element 350) are electrically connected to each other. The second high-frequency input/output terminal $P_{RF2}$ and the second matching terminal $P_{MC2}$ (matching element 360) are electrically disconnected from each other.

As a result, the circuit of the impedance matching circuit module 20 becomes a circuit (T-type matching circuit) in which the first external connection terminal $P_{IO1}$ and the second external connection terminal $P_{IO2}$ are connected to each other through a series circuit including the matching elements 330 and 340, and a connection node between the matching elements 330 and 340 is connected to the ground through the matching element 350.

In FIG. 7G, the first switch device 101 is off and the second and third switch devices 102 and 103 are on.

In this case, the first high-frequency input/output terminal $P_{RF1}$ and the second high-frequency input/output terminal $P_{RF2}$ are electrically connected to each other through the matching element 330. The first high-frequency input/output terminal $P_{RF1}$ and the first matching terminal $P_{MC1}$ (matching element 350) are electrically connected to each other. The second high-frequency input/output terminal $P_{RF2}$ and the second matching terminal $P_{MC2}$ (matching element 360) are electrically connected to each other.

As a result, the circuit of the impedance matching circuit module 20 becomes a circuit (two-stage L-type matching circuit) in which the first external connection terminal $P_{IO1}$ and the second external connection terminal $P_{IO2}$ are connected to each other through a series circuit including the matching elements 330 and 340, a connection node between the matching elements 330 and 340 is connected to the ground through the matching element 350, and a connection node between the second external connection terminal $P_{IO2}$ and the matching element 330 is connected to the ground through the matching element 360.

In FIG. 7H, the first and second switch devices 101 and 102 are off and the third switch device 103 is on.

In this case, the first high-frequency input/output terminal $P_{RF1}$ and the second high-frequency input/output terminal $P_{RF2}$ are electrically connected to each other through the matching element 330. The first high-frequency input/output terminal $P_{RF1}$ and the first matching terminal $P_{MC1}$ (matching element 350) are electrically disconnected from each other. The second high-frequency input/output terminal $P_{RF2}$ and the second matching terminal $P_{MC2}$ (matching element 360) are electrically connected to each other.

As a result, the circuit of the impedance matching circuit module 20 becomes a circuit (L-type matching circuit), in which the first external connection terminal $P_{IO1}$ and the second external connection terminal $P_{IO2}$ are connected to each other through a series circuit including the matching elements 330 and 340, and a connection node between the second external connection terminal $P_{IO2}$ and the matching element 330 is connected to the ground through the matching element 360.

In this manner, with the configuration of the present preferred embodiment, eight different kinds of circuit configurations are provided through on/off control of the first, second, and third switch devices 101, 102, and 103. As a result, a plurality of types of the impedance matching circuit modules 20 with different impedance characteristics are provided, only through switching control. Further, a greater variety of impedance is achieved through selection between an inductor and a capacitor and selection of an element value (inductance or capacitance) for each matching element, without changing the overall shape and configuration of the impedance matching circuit module 20. Not only the type of matching element connected between the first high-frequency input/output terminal $P_{RF1}$ and the second high-frequency input/output terminal $P_{RF2}$, i.e., series-connected matching element, but also the types of matching elements connected between a ground potential and the transmission path connecting the first high-frequency input/output terminal $P_{RF1}$ to the second high-frequency input/output terminal $P_{RF2}$, i.e., shunt-connected matching elements, can be selected, such that a still wider range of impedance is achieved.

Figure 8:
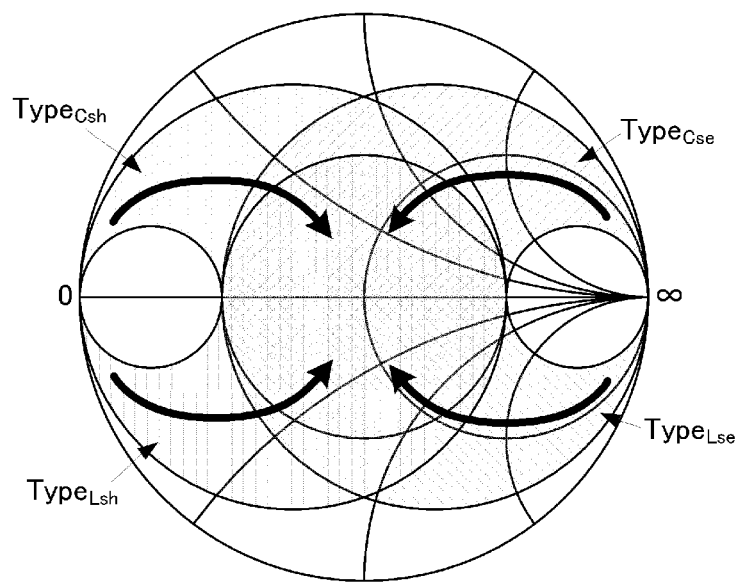
FIG. 8 is a Smith chart explaining an impedance adjusting operation performed by series matching elements and shunt matching elements.

FIG. 8 is a Smith chart explaining the impedance adjusting operation performed by series matching elements and shunt matching elements. In FIG. 8, Type$_{Csh}$ indicates the case in which the shunt matching elements are defined by capacitors, and Type$_{Lsh}$ indicates the case in which the shunt matching elements are defined by inductors. Type$_{Cse}$ indicates the case in which the series matching elements are defined by capacitors and Type$_{Lse}$ indicates the case in which the series matching elements are defined by inductors.

Referring to FIG. 8, for example, when the shunt matching elements are defined by capacitors, the impedance is adjusted so as to move clockwise from a region of less than about 50 Ω to a region of a predetermined range including about 50 Ω in the Smith chart. When the shunt matching elements are defined by inductors, the impedance is adjusted so as to move counterclockwise from a region of less than about 50 Ω to a region of a predetermined range including about 50 Ω in the Smith chart. When the series matching elements are defined by capacitors, the impedance is adjusted so as to move counterclockwise from a region of more than about 50 Ω to a region of a predetermined range including about 50 Ω in the Smith chart. When the series matching elements are defined by inductors, the impedance is adjusted so as to move clockwise from a region of more than about 50 Ω to a region of a predetermined range including about 50 Ω in the Smith chart.

As a result, as illustrated by the configuration of the present preferred embodiment, a desired impedance at a desired frequency is achieved by appropriately selecting series matching elements and shunt matching elements, appropriately selecting either an inductor or a capacitor for each of the matching elements, and appropriately setting the element value (inductance or capacitance). Thus, impedance matching is reliably performed between a first external circuit connected to the first external connection terminal P$_{IO1}$ and a second external circuit connected to the second external connection terminal P$_{IO2}$ for high-frequency signals in a desired band.

Figure 9:
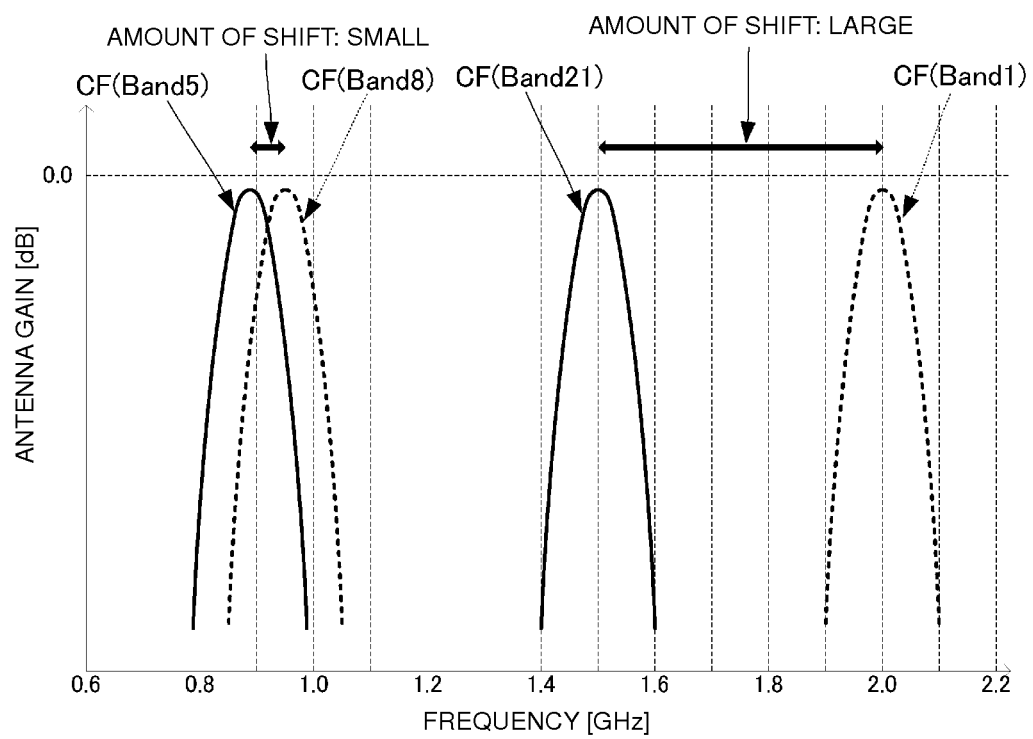
FIG. 9 is a diagram illustrating antenna gains in respective bands in a case where the impedance matching circuit module according to the first preferred embodiment of the present invention is used.

FIG. 9 is a diagram illustrating antenna gains in respective bands in the case in which the impedance matching circuit module according to the first preferred embodiment of the present invention is used. In FIG. 9, the horizontal axis represents frequency and the vertical axis represents antenna gain. Note that an antenna is connected to the first external connection terminal P$_{IO1}$ and a high-frequency front end unit is connected to the second external connection terminal P$_{IO2}$. The solid lines and broken lines in FIG. 9 respectively show antenna gains for the on state and off state of the switch devices. For example, the solid lines show the antenna gains when the switch devices are in an off state and the broken lines show the antenna gains when the switch devices are in an on state.

As illustrated in FIG. 9, by including the impedance matching circuit module of the present preferred embodiment, even in the case of band 5 and band 8 whose frequency bands are close to each other, a frequency band with a high antenna gain is selectable through on/off control of the switch devices. For example, in the case of FIG. 9, the antenna gain in band 8 is high and the antenna gain in band 5 is low when the switch devices are in an off state, but when the switch devices are controlled so as to be in an on state, the antenna gain in band 5 is increased to a high level.

In this manner, when the impedance matching circuit module of the present preferred embodiment is used, even in the case of bands close to each other, a high antenna gain is achieved in a band for which transmission and reception are performed when the high-frequency signals of the respective bands are transmitted and received.

Further, as illustrated in FIG. 9, also in the case of band 1 and band 21 whose frequency bands are spaced apart from each other, the frequency band in which the antenna gain is high is selected through on/off control of the switch devices, when the impedance matching circuit module of the present preferred embodiment is used. For example, in the case of FIG. 9, although the antenna gain in band 1 is high and the antenna gain in band 21 is low when the switch devices are in an off state, the antenna gain in band 21 is increased to a high level when the switch devices are controlled so as to be in an on state.

As described above, by using the impedance matching circuit module of the present preferred embodiment, impedance matching is performed in a wide band. Impedance matching is performed in a wide band using a simple configuration as described above. Further, the size of the impedance matching circuit module enabling impedance matching to be performed in a wide band is effectively reduced.

An impedance matching switch circuit module and an impedance matching circuit module according to a second preferred embodiment of the present invention will now be described with reference to the drawings.

In an impedance matching circuit module 20A of the present preferred embodiment, an impedance matching switch circuit module 10A is different from the impedance matching switch circuit module 10 described in the first preferred embodiment, and the remainder of the configuration is preferably the same or substantially the same as that of the impedance matching circuit module 20 described in the first preferred embodiment. Thus, only the differences will be described specifically.

Figure 10:
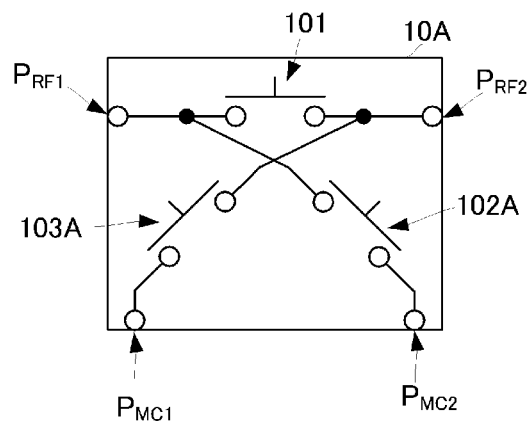
FIG. 10 is an equivalent circuit diagram of an impedance matching switch circuit module according to a second preferred embodiment of the present invention.
Figure 11:
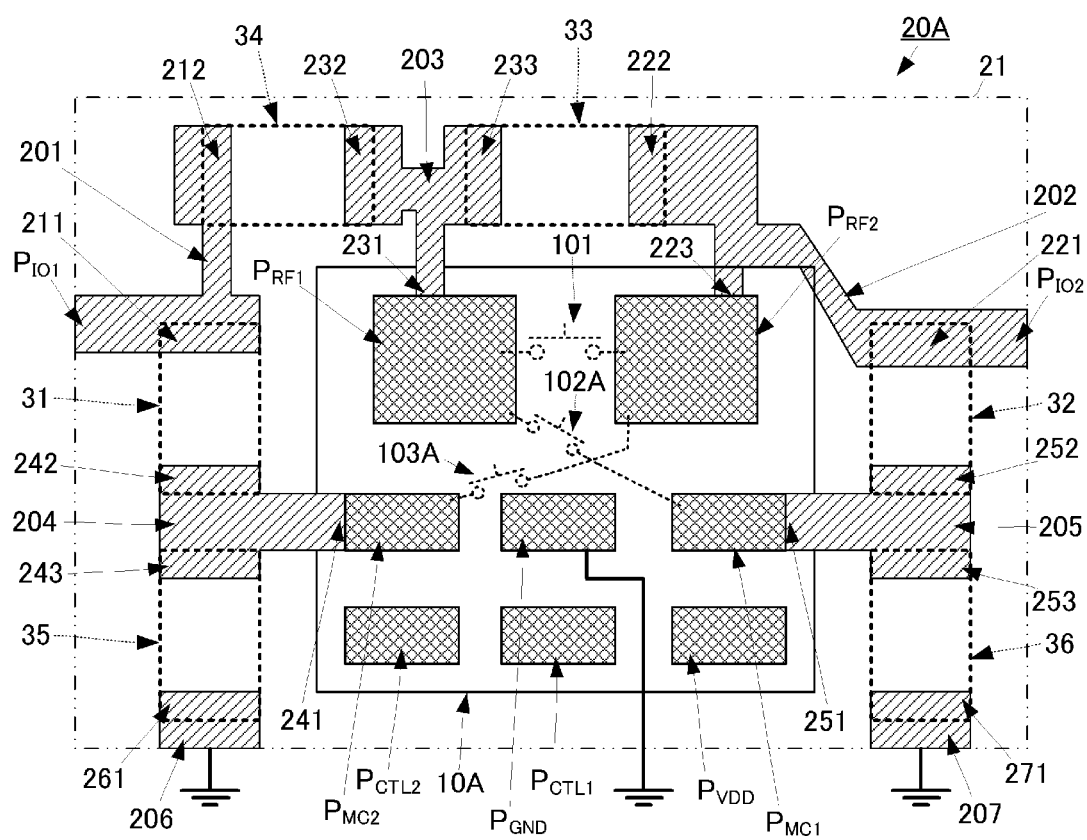
FIG. 11 is a configuration diagram illustrating a manner in which an impedance matching circuit module including the impedance matching switch circuit module according to the second preferred embodiment of the present invention is used.

FIG. 10 is an equivalent circuit diagram of the impedance matching switch circuit module 10A according to the second preferred embodiment of the present invention. FIG. 11 is a configuration diagram illustrating a manner in which the impedance matching circuit module 20A including the impedance matching switch circuit module 10A according to the second preferred embodiment of the present invention is used.

Referring to FIG. 10, from the viewpoint of the configuration of a circuit, the impedance matching switch circuit module 10A includes a modified π-type circuit including a first switch device 101, a second switch device 102A, and a third switch device 103A. The first, second, and third switch devices 101, 102A, and 103A are preferably SPST switches, for example.

One end of the first switch device 101 is connected to the first high-frequency input/output terminal P$_{RF1}$. The other end of the first switch device 101 is connected to the second high-frequency input/output terminal P$_2$.

One end of the second switch device 102A is connected to the first high-frequency input/output terminal P$_{RF1}$. The other end of the second switch device 102A is connected to the second matching terminal P$_{MC2}$.

One end of the third switch device 103A is connected to the second high-frequency input/output terminal P$_2$. The other end of the third switch device 103A is connected to the first matching terminal P$_{MC1}$.

The external shape of the impedance matching switch circuit module 10A is preferably the same or substantially the same as that of the impedance matching switch circuit module 10. However, the arrangement of the first and second matching terminals P$_{MC1}$ and P$_{MC2}$ is reverse as compared to the arrangement in the impedance matching switch circuit module 10. Specifically, in the second preferred embodiment, the first matching terminal P$_{MC1}$ is close to the second high-frequency input/output terminal P$_{RF2}$, and the second matching terminal $P_{MC2}$ is close to the first high-frequency input/output terminal $P_{RF1}$. The impedance matching circuit module 10A having this configuration is mounted on the mounting substrate 21 in a manner similar to that in the first preferred embodiment, as illustrated in FIG. 11.

By including the configuration described above, the conductor pattern 203 and the conductor pattern 205 are controlled so as to be electrically connected to or disconnected from each other by the second switch device 102A. The conductor pattern 202 and the conductor pattern 204 are controlled so as to be electrically connected to or disconnected from each other by the third switch device 103A.

By mounting matching elements having desired element values (inductances or capacitances) in appropriate regions among the matching element mounting regions 31 to 36, the impedance matching circuit module 20A achieves a desired impedance, similarly to the impedance matching circuit module 20 described in the first preferred embodiment.

Next, specific usage examples will be described.

Figure 12A:
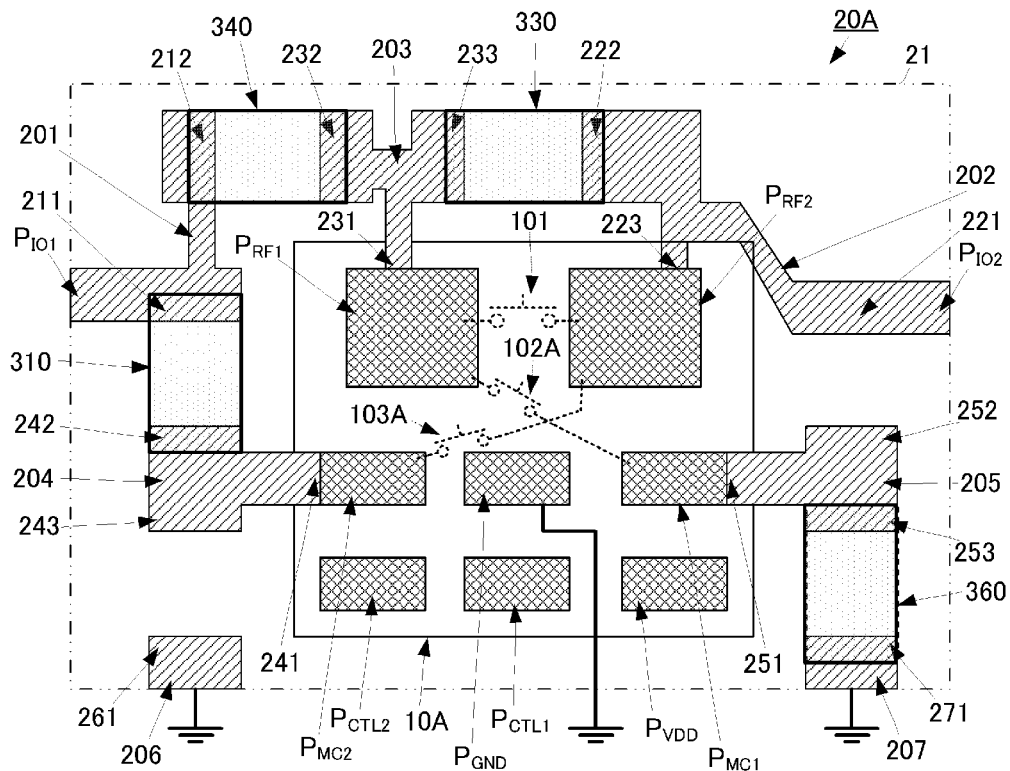
FIGS. 12A and 12B are diagrams illustrating a first example of using the impedance matching circuit module according to the second preferred embodiment of the present invention.
Figure 12B:
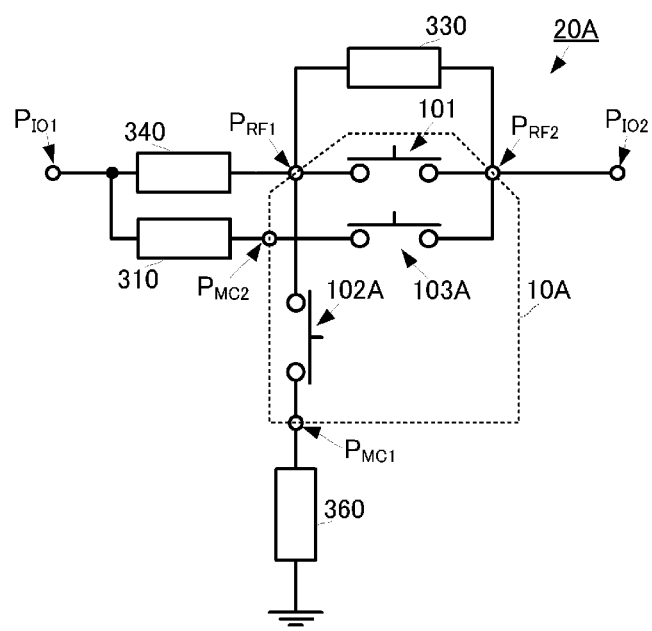

FIGS. 12A and 12B are diagrams illustrating an example of using the impedance matching circuit module 20A according to the second preferred embodiment of the present invention. FIG. 12A is a configuration diagram and FIG. 12B is an equivalent circuit diagram thereof.

A matching element 310 is mounted in the matching element mounting region 31, and the conductor patterns 201 and 204 are connected to each other through the matching element 310. The matching element 330 is mounted in the matching element mounting region 33, and the conductor patterns 202 and 203 are connected to each other through the matching element 330. The matching element 340 is mounted in the matching element mounting region 34, and the conductor patterns 201 and 203 are connected to each other through the matching element 340. The matching element 360 is mounted in the matching element mounting region 36, and the conductor patterns 205 and 207 are connected to each other through the matching element 360.

With the configuration described above, the impedance matching circuit module 20A has a circuit configuration illustrated in FIG. 12B. Specifically, the first external connection terminal $P_{IO1}$ and the first high-frequency input/output terminal $P_{RF1}$ are connected to each other through the matching element 340. The first high-frequency input/output terminal $P_{RF1}$ and the second high-frequency input/output terminal $P_{RF2}$ are connected to each other through a parallel circuit including the first switch device 101 and the matching element 330. The first external connection terminal $P_{IO1}$ and the second matching terminal $P_{MC2}$ are connected to each other through the matching element 310.

As a result, the first external connection terminal $P_{IO1}$ and the second external connection terminal $P_{IO2}$ are connected to each other through a series circuit including the matching element 340 and a parallel circuit including the first switch device 101 and the matching element 330, and through a series circuit including the matching element 310 and the third switch device 103A.

The first matching terminal $P_{MC1}$ is connected to a ground potential through the matching element 360. As a result, the first high-frequency input/output terminal $P_{RF1}$ is connected to the ground potential through a series circuit including the second switch device 102A and the matching element 360.

In the circuit configuration described above, the impedance matching circuit module 20A achieves various types of impedance matching through on/off control of the first, second, and third switch devices 101, 102A, and 103A, similarly to the impedance matching circuit module 20 described in the first preferred embodiment.

Figure 13A:
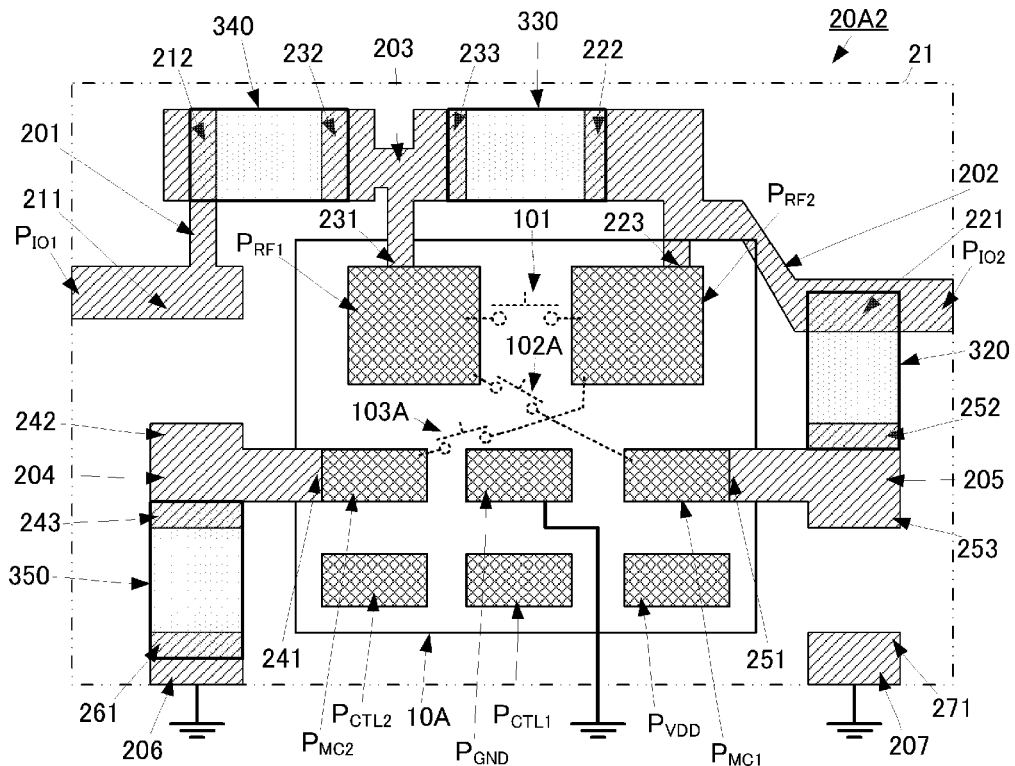
FIGS. 13A and 13B are diagrams illustrating a second example of using the impedance matching circuit module according to the second preferred embodiment of the present invention.
Figure 13B:
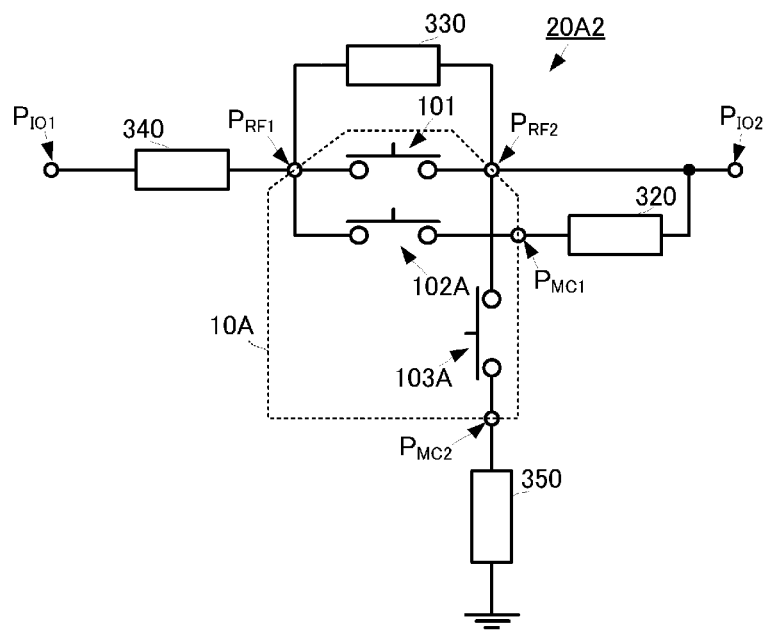

FIGS. 13A and 13B are diagrams illustrating another example of using the impedance matching circuit module 20A according to the second preferred embodiment of the present invention. FIG. 13A is a configuration diagram and FIG. 13B is an equivalent circuit diagram thereof.

A matching element 320 is mounted in the matching element mounting region 32. As a result, the conductor pattern 202 and the conductor pattern 205 are connected to each other through the matching element 320. The matching element 330 is mounted in the matching element mounting region 33, and the conductor patterns 202 and 203 are connected to each other through the matching element 330. The matching element 340 is mounted in the matching element mounting region 34, and the conductor patterns 201 and 203 are connected to each other through the matching element 340. The matching element 350 is mounted in the matching element mounting region 35, and the conductor patterns 204 and 206 are connected to each other through the matching element 350.

With the configuration described above, an impedance matching circuit module 20A2 has a circuit configuration illustrated in FIG. 13B. Specifically, the first external connection terminal $P_{IO1}$ and the first high-frequency input/output terminal $P_{RF1}$ are connected to each other through the matching element 340. The first high-frequency input/output terminal $P_{RF1}$ and the second high-frequency input/output terminal $P_{RF2}$ are connected to each other through a parallel circuit including the first switch device 101 and the matching element 330. The second external connection terminal $P_{IO2}$ and the first matching terminal $P_{MC1}$ are connected to each other through the matching element 320.

As a result, the first external connection terminal $P_{IO1}$ and the second external connection terminal $P_{IO2}$ are connected to each other through a circuit in which the matching element 340 is connected in series with a parallel circuit which includes a series circuit including the second switch device 102A and the matching element 320 and a parallel circuit including the first switch device 101 and the matching element 330.

The second matching terminal $P_{MC2}$ is connected to a ground potential through the matching element 350. As a result, the second high-frequency input/output terminal $P_{RF2}$ is connected to the ground potential through a series circuit including the third switch device 103A and the matching element 350.

In the circuit configuration described above, the impedance matching circuit module 20A2 achieves various types of impedance matching through on/off control of the first, second, and third switch devices 101, 102A, and 103A, similarly to the impedance matching circuit module 20 described in the first preferred embodiment.

Impedance matching switch circuit modules and impedance matching circuit modules according to a third preferred embodiment of the present invention will now be described with reference to the drawings.

In the impedance matching circuit modules of the third preferred embodiment, configurations of impedance matching switch circuit modules 10B and 10C are different from the configuration of the impedance matching switch circuit module 10 described in the first preferred embodiment, and the remainder of the configurations is preferably the same or substantially the same as the configuration of the impedance matching circuit module 20 described in the first preferred embodiment. Thus, only the differences will be described specifically.

Figure 14A:
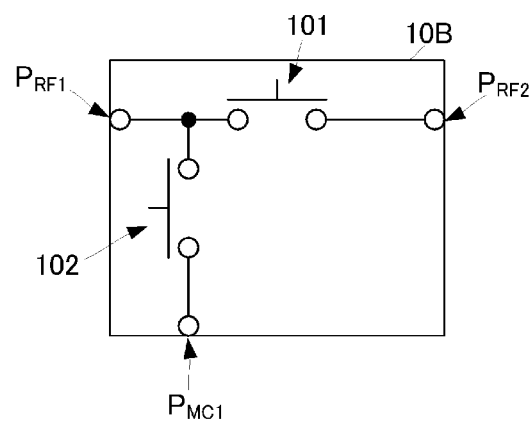
FIGS. 14A and 14B are equivalent circuit diagrams of impedance matching switch circuit modules according to a third preferred embodiment of the present invention.
Figure 14B:
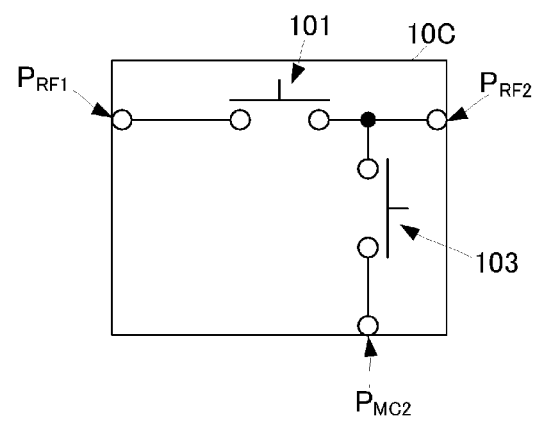

FIGS. 14A and 14B are equivalent circuit diagrams of the impedance matching switch circuit modules 10B and 10C.

The impedance matching switch circuit modules 10B and 10C of the third preferred embodiment each includes a circuit configuration in which switch devices are connected to define an L-type circuit. Specifically, the impedance matching switch circuit module 10B illustrated in FIG. 14A has a configuration in which the third switch device 103 and the second matching terminal $P_{MC2}$ have been omitted from the configuration of the impedance matching switch circuit module 10 described in the first preferred embodiment. The impedance matching switch circuit module 10C illustrated in FIG. 14B has a configuration in which the second switch device 102 and the first matching terminal $P_{MC1}$ have been omitted from the configuration of the impedance matching switch circuit module 10 described in the first preferred embodiment.

These configurations, although simple, also allow various types of impedance matching to be achieved, similarly to the preferred embodiments described above.

Note that although examples have been described in which the matching element mounting region 34 is preferably provided between the first high-frequency input/output terminal $P_{RF1}$ and the first external connection terminal $P_{IO1}$ in the preferred embodiments described above, the first high-frequency input/output terminal $P_{RF1}$ and the first external connection terminal $P_{IO1}$ may be directly connected to each other through a conductor pattern. On the other hand, the matching element mounting region may be provided between the second high-frequency input/output terminal $P_{RF2}$ and the second external connection terminal $P_{IO2}$.

However, it is more preferable to use a configuration in which the first external connection terminal $P_{IO1}$ is connected to an antenna while the matching element mounting region is provided only on the first external connection terminal $P_{IO1}$ side, as in the preferred embodiments described above, because impedance matching is performed at a location closer to the antenna.

Further, in the preferred embodiments described above, although examples have been described in which a first group including terminal conductors for the first and second high-frequency input/output terminals $P_{RF1}$ and $P_{RF2}$ and a second group including terminal conductors for the first and second matching terminals $P_{MC1}$ and $P_{MC2}$ and a terminal conductor for the ground terminal $P_{GND}$ r and a third group including a terminal conductor for the driving voltage application terminal $P_{VDD}$ and terminal conductors for the control voltage application terminals $P_{CTL1}$ and $P_{CTL2}$ are arranged in the first direction, the arrangement of the terminal conductors described below may also be used.

Figure 15A:
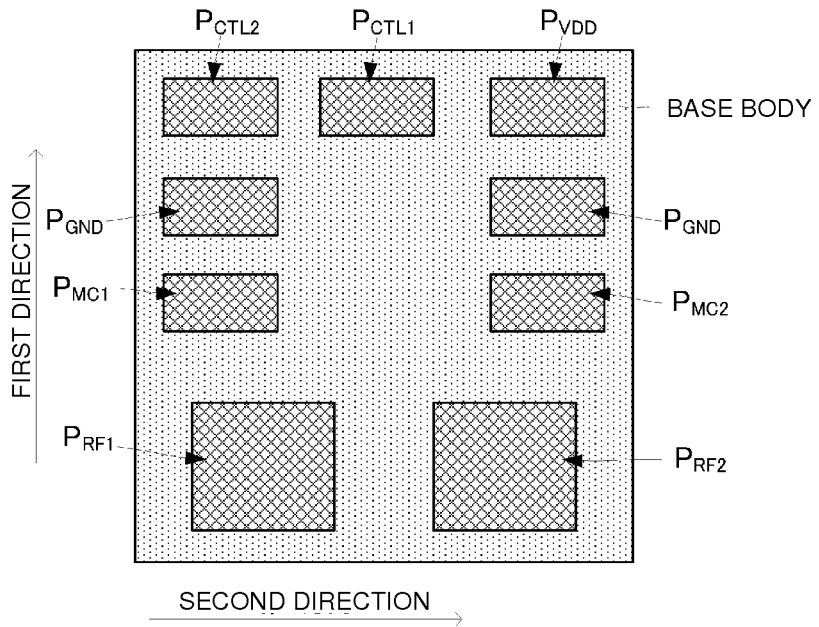
FIGS. 15A and 15B are diagrams illustrating examples of arranging the terminal conductors of an impedance matching switch circuit module.
Figure 15B:
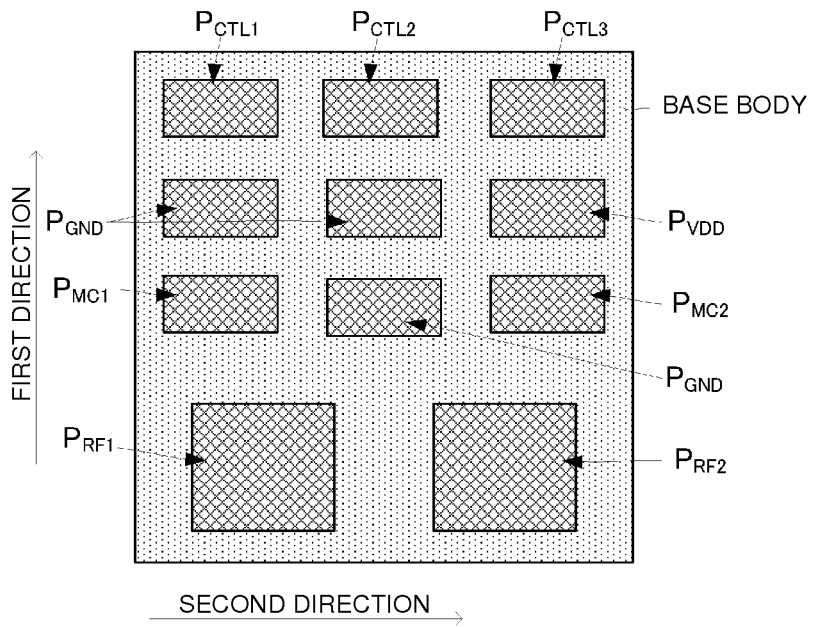

FIGS. 15A and 15B are diagrams illustrating examples of arrangements of the terminal conductors of an impedance matching switch circuit module.

In the configuration illustrated in FIG. 15A, terminal conductors for the ground terminals $P_{GND}$ are further arranged between the second group and the third group. As a result, high isolation between the first and second matching terminals $P_{MC1}$ and $P_{MC2}$ included in the second group and the terminal conductor for the driving voltage application terminal $P_{VDD}$ which is included in the third group and the terminal conductors for the control voltage application terminals $P_{CTL1}$ and $P_{CTL2}$ is ensured.

Further, in the configuration illustrated in FIG. 15A, the terminal conductor for the ground terminal $P_{GND}$ between the terminal conductors for the first and second matching terminals $P_{MC1}$ and $P_{MC2}$ in the second group is omitted. As a result, the number of terminal conductors on the back surface is reduced. In this case, however, it is preferable that the distance between the terminal conductors for the first and second matching terminals $P_{MC1}$ and $P_{MC2}$ in the second direction be as large as possible. In other words, it is preferable that the terminal conductors for the first and second matching terminals $P_{MC1}$ and $P_{MC2}$ be respectively arranged near the two ends of the base body in the second direction.

Further, in the configuration illustrated in FIG. 15B, the terminal conductor for the driving voltage application terminal $P_{VDD}$ and the terminal conductors for the control voltage application terminals $P_{CTL1}$, $P_{CTL2}$, and $P_{CTL3}$ are provided in the third group. In this case, as illustrated in FIG. 15B, these four terminals preferably are arranged in two rows, for example. It is preferable that the terminal conductor for the driving voltage application terminal $P_{VDD}$ for a DC voltage be arranged at a position near the second group and the terminal conductors for the control voltage application terminals $P_{CTL1}$, $P_{CTL2}$, and $P_{CTL3}$ to which control voltages provided by square wave signals are input be arranged at positions far from the second group. With this arrangement, the terminal conductors for the first and second matching terminals $P_{MC1}$ and $P_{MC2}$ are unlikely to be influenced by noise caused by control voltages. In addition, an influence from noise caused by the control voltages is further reduced by arranging the terminal conductors for the ground terminals $P_{GND}$ between the terminal conductors for the first and second matching terminals $P_{MC1}$ and $P_{MC2}$ and the terminal conductors for the control voltage application terminals $P_{CTL1}$ and $P_{CTL2}$.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An impedance matching switch circuit module comprising:
    an impedance matching switch circuit comprising:
        a first high-frequency input/output terminal and a second high-frequency input/output terminal defining input/output terminals for a high-frequency signal;
        a first matching terminal configured to be connected to an external matching element;
        a first switch device connected between the first high-frequency input/output terminal and the second high-frequency input/output terminal; and
        a second switch device connected between the first matching terminal and a first high-frequency input/output terminal side of the first switch device or a second high-frequency input/output terminal side of the first switch device;
    a switch IC including the first switch device and the second switch device provided therein; and
    a base body having a rectangular or substantially rectangular shape; wherein
    the switch IC is mounted on a front surface of the base body, and the first high-frequency input/output terminal, the second high-frequency input/output terminal, the first matching terminal, and a plurality of terminals configured to perform driving control of the switch IC are provided on a back surface of the base body opposite to the front surface of the base body;
    a first group including the first high-frequency input/output terminal and the second high-frequency input/output terminal, a second group including the first matching terminal, and a third group including the plurality of terminals configured to perform driving control of the switch IC are arranged in a first direction of the back surface; and the first group and the second group are adjacent to each other in the first direction.

2. The impedance matching switch circuit module according to claim 1, further comprising:
a second matching terminal configured to be connected to a matching element that is different from the external matching element connected to the first matching terminal; and
a third switch device connected between the second matching terminal and a side of the first switch device not connected to the second switch device.

3. The impedance matching switch circuit module according to claim 2, wherein the first switch device, the second switch device, and the third switch device are configured to define a π-type circuit.

4. An impedance matching circuit module including the impedance matching switch circuit module according to claim 1, comprising:
a mounting substrate on which the base body is mounted; wherein
the mounting substrate includes:
a first conductor pattern connecting the first high-frequency input/output terminal to a first external connection terminal;
a second conductor pattern connecting the second high-frequency input/output terminal to a second external connection terminal arranged so as to be opposed to the first external connection terminal with the base body therebetween;
a third conductor pattern connected to the first matching terminal;
a first matching element mounting region provided between the first conductor pattern and the second conductor pattern; and
a second matching element mounting region provided between the third conductor pattern and the first conductor pattern or a conductor pattern connected to the second conductor pattern or to ground.

5. The impedance matching circuit module according to claim 4, wherein a matching element is selectively mounted in the first matching element mounting region and the second matching element mounting region.

6. The impedance matching circuit module according to claim 4, wherein
a third matching element mounting region is provided at a location along the first conductor pattern; and
a matching element is mounted in the third matching element mounting region.

7. The impedance matching circuit module according to claim 4, wherein the matching element includes a capacitor.

8. The impedance matching switch circuit module according to claim 1, wherein the first switch device and the second switch device are single-pole single-throw switches.

9. An impedance matching switch circuit module comprising:
an impedance matching switch circuit comprising:
a first high-frequency input/output terminal and a second high-frequency input/output terminal defining input/output terminals for a high-frequency signal;
a first matching terminal configured to be connected to an external matching element;
a first switch device connected between the first high-frequency input/output terminal and the second high-frequency input/output terminal;
a second switch device connected between the first matching terminal and a first high-frequency input/output terminal side of the first switch device or a second high-frequency input/output terminal side of the first switch device;
a second matching terminal configured to be connected to a matching element that is different from the external matching element connected to the first matching terminal; and
a third switch device connected between the second matching terminal and a side of the first switch device not connected to the second switch device;
a switch IC including the first switch device, the second switch device, and the third switch device provided therein; and
a base body having a rectangular or substantially rectangular shape; wherein
the switch IC is mounted on a front surface of the base body, and the first high-frequency input/output terminal, the second high-frequency input/output terminal, the first matching terminal, the second matching terminal, and a plurality of terminals configured to perform driving control of the switch IC are provided on a back surface of the base body opposite to the front surface of the base body;
a first group including the first high-frequency input/output terminal and the second high-frequency input/output terminal, a second group including the first matching terminal and the second matching terminal, and a third group including the plurality of terminals configured to perform driving control of the switch IC are arranged in a first direction of the back surface; and
the first group and the second group are adjacent to each other in the first direction.

10. The impedance matching switch circuit module according to claim 9, wherein an order in which the first high-frequency input/output terminal and the second high-frequency input/output terminal in the first group are arranged is the same as an order in which the first matching terminal and the second matching terminal in the second group are arranged, in a second direction perpendicular or substantially perpendicular to the first direction.

11. The impedance matching switch circuit module according to claim 10, wherein
the second group includes a ground connection terminal connected to ground; and
the ground connection terminal is disposed at a position between the first matching terminal and the second matching terminal.

12. An impedance matching circuit module including the impedance matching switch circuit module according to claim 10, comprising:
a mounting substrate on which the base body is mounted; wherein
the mounting substrate includes:
a first conductor pattern connecting the first high-frequency input/output terminal to a first external connection terminal;
a second conductor pattern connecting the second high-frequency input/output terminal to a second external connection terminal arranged so as to be opposed to the first external connection terminal with the base body therebetween;
a third conductor pattern connected to the first matching terminal;
a fourth conductor pattern connected to the second matching terminal;

a first matching element mounting region provided between the first conductor pattern and the second conductor pattern;
a second matching element mounting region provided between the third conductor pattern and the first conductor pattern or a conductor pattern connected to ground; and
a fourth matching element mounting region provided between the fourth conductor pattern and the second conductor pattern or a conductor pattern connected to ground.

13. The impedance matching circuit module according to claim 12, wherein a matching element is selectively mounted in the first matching element mounting region, the second matching element mounting region, and the fourth matching element mounting region.

14. The impedance matching circuit module according to claim 12, wherein
a third matching element mounting region is provided at an approximate mid-point on the first conductor pattern; and
a matching element is mounted in the third matching element mounting region.

15. The impedance matching switch circuit module according to claim 10, wherein the first high-frequency input/output terminal is arranged adjacent one end of the base body in the second direction and the second high-frequency input/output terminal is arranged adjacent to another end of the base body in the second direction opposite to the one end of the base body.

16. The impedance matching switch circuit module according to claim 10, wherein the first matching terminal is arranged adjacent one end of the base body in the second direction and the second matching terminal is arranged adjacent to another end of the base body in the second direction opposite to the one end of the base body.

17. The impedance matching switch circuit module according to claim 9, wherein an order in which the first high-frequency input/output terminal and the second high-frequency input/output terminal in the first group are arranged is reverse to an order in which the first matching terminal and the second matching terminal in the second group are arranged, in a second direction perpendicular or substantially perpendicular to the first direction.

18. An impedance matching circuit module including the impedance matching switch circuit module according to claim 17, comprising:
a mounting substrate on which the base body is mounted; wherein
the mounting substrate includes:
a first conductor pattern connecting the first high-frequency input/output terminal to a first external connection terminal;
a second conductor pattern connecting the second high-frequency input/output terminal to a second external connection terminal arranged so as to be opposed to the first external connection terminal with the base body therebetween;
a third conductor pattern connected to the first matching terminal;
a fourth conductor pattern connected to the second matching terminal;
a first matching element mounting region provided between the first conductor pattern and the second conductor pattern;
a fourth matching element mounting region provided between the third conductor pattern and the second conductor pattern or a conductor pattern connected to ground; and
a second matching element mounting region provided between the fourth conductor pattern and the first conductor pattern or a conductor pattern connected to ground.

19. The impedance matching switch circuit module according to claim 9, wherein the switch IC is a silicon-on-insulator chip.

* * * * *